US009329478B2

(12) United States Patent
Anno et al.

(10) Patent No.: US 9,329,478 B2
(45) Date of Patent: May 3, 2016

(54) POLYSILOXANE COMPOSITION AND PATTERN-FORMING METHOD

(71) Applicant: JSR CORPORATION, Tokyo (JP)

(72) Inventors: Yusuke Anno, Tokyo (JP); Takashi Mori, Tokyo (JP); Satoshi Dei, Tokyo (JP); Kazunori Takanashi, Tokyo (JP); Yushi Matsumura, Tokyo (JP); Shin-ya Minegishi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 96 days.

(21) Appl. No.: 13/739,375

(22) Filed: Jan. 11, 2013

(65) Prior Publication Data

US 2013/0130179 A1    May 23, 2013

Related U.S. Application Data

(63) Continuation of application No. PCT/JP2011/066128, filed on Jul. 14, 2011.

(30) Foreign Application Priority Data

Jul. 14, 2010  (JP) ................................ 2010-159236
Apr. 20, 2011  (JP) ................................ 2011-094448

(51) Int. Cl.
| | | |
|---|---|---|
| G03F 7/20 | (2006.01) | |
| G03F 7/075 | (2006.01) | |
| G03F 7/09 | (2006.01) | |
| H01L 21/02 | (2006.01) | |
| C08K 5/34 | (2006.01) | |

(52) U.S. Cl.
CPC ............... *G03F 7/0757* (2013.01); *C08K 5/34* (2013.01); *G03F 7/0752* (2013.01); *G03F 7/091* (2013.01); *G03F 7/20* (2013.01); *H01L 21/02126* (2013.01); *H01L 21/02216* (2013.01)

(58) Field of Classification Search
CPC ...... G03F 7/075; G03F 7/0752; G03F 7/0757
USPC .................. 430/270.1, 271.1, 272.1, 313
See application file for complete search history.

(56) References Cited

U.S. PATENT DOCUMENTS

| | | | |
|---|---|---|---|
| 6,747,079 B2 | 6/2004 | Bressieux et al. | |
| 7,476,485 B2* | 1/2009 | Hatakeyama et al. | 430/270.1 |
| 7,510,816 B2* | 3/2009 | Takemura et al. | 430/270.1 |
| 7,625,695 B2* | 12/2009 | Moon et al. | 430/323 |
| 2003/0149170 A1 | 8/2003 | Bressieux et al. | |
| 2007/0238300 A1 | 10/2007 | Ogihara et al. | |
| 2009/0251652 A1* | 10/2009 | Kojima et al. | 349/138 |
| 2010/0119970 A1* | 5/2010 | Ohsawa et al. | 430/270.1 |
| 2010/0261097 A1* | 10/2010 | Sun | 430/5 |
| 2010/0285407 A1* | 11/2010 | Ogihara et al. | 430/272.1 |
| 2010/0291487 A1* | 11/2010 | Nakajima et al. | 430/313 |
| 2011/0287369 A1* | 11/2011 | Shibayama et al. | 430/316 |
| 2011/0318691 A1* | 12/2011 | Tsuchimura et al. | 430/285.1 |
| 2012/0202349 A1* | 8/2012 | Sun | 438/702 |

FOREIGN PATENT DOCUMENTS

| | | | |
|---|---|---|---|
| JP | 2000-356854 A | | 12/2000 |
| JP | 2002-082437 | | 3/2002 |
| JP | 2003-528959 | | 9/2003 |
| JP | 2005-272697 | | 10/2005 |
| JP | 2005-283991 | | 10/2005 |
| JP | 2008-069210 | | 3/2008 |
| JP | 2008-158002 | * | 7/2008 |
| JP | 2008-292975 | | 12/2008 |
| WO | WO 01/72888 | | 10/2001 |
| WO | WO 2006/126406 | | 11/2006 |
| WO | WO 2007/238300 A1 | | 10/2007 |
| WO | WO 2009/088039 | * | 7/2009 |
| WO | WO 2010/067905 | | 6/2010 |
| WO | WO 2010/071155 | * | 6/2010 |

OTHER PUBLICATIONS

Machine translation of JP 2008-158002, published on Jul. 10, 2008.*
International Search Report for corresponding International Application No. PCT/JP2011/066128, Nov. 1, 2011.
Office Action issued on Jan. 27, 2015, in Japanese Patent Application No. 2011-156046 filed Jul. 14, 2011 (w/ English translation).
Office Action issued on Jan. 6, 2015, in Japanese Patent Application No. 2011-094448, with English-language Translation.
Office Action issued Mar. 24, 2015, in Japanese Patent Application No. 2011-094448 filed Apr. 20, 2011(w/ English translation).
Office Action issued Apr. 7, 2015, in Japanese Patent Application No. 2011-156046 filed Jul. 14, 2011 (w/ English translation).

* cited by examiner

*Primary Examiner* — Anca Eoff
(74) *Attorney, Agent, or Firm* — Oblon, McClelland, Maier & Neustadt, L.L.P.

(57) ABSTRACT

A polysiloxane composition includes a polysiloxane, and a first compound. The first compound includes a nitrogen-containing heterocyclic ring structure, and a polar group, an ester group or a combination thereof. A pattern-forming method includes coating the polysiloxane composition on a substrate to be processed to provide a silicon-containing film. A resist composition is coated on the silicon-containing film to provide a resist coating film. The resist coating film is selectively irradiated with a radioactive ray through a photomask to expose the resist coating film. The exposed resist coating film is developed to form a resist pattern. The silicon-containing film and the substrate to be processed are sequentially dry etched using the resist pattern as a mask.

12 Claims, No Drawings

POLYSILOXANE COMPOSITION AND PATTERN-FORMING METHOD

CROSS-REFERENCE TO RELATED APPLICATIONS

The present application is a continuation application of International Application No. PCT/JP2011/066128, filed Jul. 14, 2011, which claims priority to Japanese Patent Application No. 2010-159236, filed Jul. 14, 2010 and to Japanese Patent Application No. 2011-094448, filed Apr. 20, 2011. The contents of these applications are incorporated herein by reference in their entirety.

BACKGROUND OF THE INVENTION

1. Field of the Invention

The present invention relates to a polysiloxane composition, and a pattern-forming method.

2. Discussion of the Background

Pattern formation in manufacturing elements for semiconductors and the like frequently uses a process in which a resist pattern obtained by developing a resist coating film is used as a mask in etching an organic or inorganic material underlying thereof. In such a process, disadvantages such as detachment of the resist pattern from the underlayer material, dissolution of the underlayer material into a developer solution used for developing the resist coating film, and the like may be caused. In addition, due to an etching rate of the resist pattern similar to that of the underlayer material, disadvantages such as failure in microprocessing of the material of the underlayer, and occurrence of damage on the underlayer material when the resist pattern is removed by oxygen ashing may be also made.

In order to solve the foregoing disadvantages, a technique was investigated in which an inorganic resist underlayer film is provided between a resist coating film and a material of an underlayer, and etching of the resist underlayer film is carried out first using the resist pattern as a mask, and then etching of the underlayer material is carried out using a pattern of the resist underlayer film as a mask (see PCT International Publication No. 2006/126406).

As miniaturization of patterns has progressed, there is a need for the resist underlayer film to have more superior performances, i.e., low substrate reflectance, a low residual resist amount in the region after the removal of the resist film upon development, and superior resistance against an alkaline developer solution and superior oxygen-ashing resistance. In addition, for the purpose of forming more excellent patterns on a substrate to be processed, the resist pattern formed on the resist underlayer film is also required to have superior pattern collapse resistance and an excellent pattern configuration.

SUMMARY OF THE INVENTION

According to one aspect of the present invention, a polysiloxane composition includes a polysiloxane, and a first compound. The first compound includes a nitrogen-containing heterocyclic ring structure, and a polar group, an ester group or a combination thereof.

According to another aspect of the present invention, a pattern-forming method includes coating the polysiloxane composition on a substrate to be processed to provide a silicon-containing film. A resist composition is coated on the silicon-containing film to provide a resist coating film. The resist coating film is selectively irradiated with a radioactive ray through a photomask to expose the resist coating film. The exposed resist coating film is developed to form a resist pattern. The silicon-containing film and the substrate to be processed are sequentially dry etched using the resist pattern as a mask.

DESCRIPTION OF THE EMBODIMENTS

An embodiment of the present invention made for solving the foregoing problems provides a polysiloxane composition containing (A) a polysiloxane, and (B) a compound having a nitrogen-containing heterocyclic ring structure, and a polar group, an ester group or a combination thereof (hereinafter, may be also referred to as "compound (B)").

The polysiloxane composition of the embodiment of the present invention enables a resist pattern that is superior in pattern collapse resistance and has an excellent pattern configuration to be formed on a silicon-containing film provided from the polysiloxane composition, due to containing the compound (B) in addition to the polysiloxane (A). Although the reason for achieving the foregoing effects due to including the compound (B) in the polysiloxane composition is not necessarily clear, it is believed that the aforementioned effects can be efficiently achieved due to, for example, suppression of diffusion of an acid within the resist coating film which occurs via the silicon-containing film during post exposure baking (PEB), as well as inhibition of sublimation of the compound (B) during baking for providing the silicon-containing film thereby resulting in remanence in the silicon-containing film since the compound (B) has a polar group, an ester group or a combination thereof.

It is preferred that the polysiloxane composition further contains (C) a compound that generates an acid by at least either one of irradiation with an ultraviolet ray and heating (hereinafter, may be also referred to as "compound (C)").

According to the polysiloxane composition, as a result of further containing the compound (C), formation of a resist pattern having superior pattern collapse resistance and an excellent pattern configuration is enabled on the provided silicon-containing film, in the case of resist pattern-forming by way of not only development with an alkali but also development with an organic solvent.

The compound (B) is preferably a compound having a polar group and an ester group. According to the polysiloxane composition, since the compound (B) has both a polar group and an ester group, sublimation of the compound (B) can be further inhibited during baking for providing the silicon-containing film, whereby the aforementioned effects can be further efficiently achieved.

The compound (B) is preferably a compound having, as the polar group, a hydroxyl group, a carboxyl group or a combination thereof. According to the polysiloxane composition, since the compound (B) has the above-specified group, sublimation of the compound (B) can be further improved during baking for providing the silicon-containing film, whereby the aforementioned effects can be further efficiently achieved.

The compound (B) is preferably a compound having, as the ester group, a group represented by the following formula (i), and having a structure in which the group bonds to a nitrogen atom.

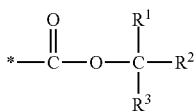

In the formula (i), $R^1$, $R^2$ and $R^3$ each independently represent an alkyl group having 1 to 4 carbon atoms, or a monovalent alicyclic hydrocarbon group having 4 to 12 carbon atoms, wherein $R^1$ and $R^2$ may taken together represent a bivalent alicyclic hydrocarbon group having 4 to 12 carbon atoms together with the carbon atom to which $R^1$ and $R^2$ bond; and "*" denotes a binding site to a nitrogen atom.

The compound having the above-specified structure generates a basic amino group upon dissociation of the —$CR^1R^2R^3$ group by an action of the acid. Therefore, when such a compound is used as the compound (B), the polysiloxane composition has superior storage stability even in the state of a solution.

The compound (B) is preferably a compound represented by the following formula (1):

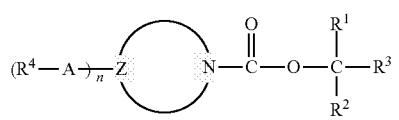

in the formula (1), $R^1$, $R^2$ and $R^3$ are as defined in the above formula (i); Z represents a group having a valency of (n+2) and representing a heterocyclic ring structure together with a nitrogen atom; A represents a single bond or a bivalent hydrocarbon group having 1 to 8 carbon atoms; $R^4$ represents a hydroxyl group or a carboxyl group; n is an integer of 1 to 6, wherein in the case in which A and $R^4$ are each present in a plurality of number, a plurality of As and $R^4$s are optionally the same or different.

When the compound (B) has the above-specified structure, the polysiloxane composition can form a resist pattern having superior pattern collapse resistance and an excellent pattern configuration on the film. In addition, the polysiloxane composition is superior in storage stability even in the state of a solution.

The polysiloxane (A) preferably contains a hydrolytic condensate of a compound represented by the following formula (S-1) (hereinafter, may be also referred to as "compound (S1)"):

in the formula (S-1), $R^5$ represents a hydrogen atom, an alkyl group having 1 to 5 carbon atoms, a cyano group, an alkenyl group or an aryl group, a part or all of hydrogen atoms included in the alkyl group are not substituted or optionally substituted by a fluorine atom, a cyano group, an aryl group which is unsubstituted or optionally substituted, or an alkoxy group having an oxetane ring; X represents a halogen atom or $OR^A$, wherein $R^A$ represents a monovalent organic group; and a is an integer of 0 to 3, wherein in the case in which $R^5$ and X are each present in a plurality of number, a plurality of $R^5$s and Xs are each optionally the same or different.

When the polysiloxane (A) is the hydrolytic condensate of the above-specified compound, the pattern collapse resistance and excellence of the pattern configuration of the resist pattern formed on the silicon-containing film obtained from the polysiloxane composition is improved.

X in the above formula (S-1) preferably represents $OR^A$. When the polysiloxane (A) is obtained from the compound having the above-specified structure, it is possible to allow a hydrolytic condensation reaction to proceed appropriately, and as a result, the pattern collapse resistance and excellence of the pattern configuration of the resist pattern formed on the silicon-containing film obtained from the polysiloxane composition is more improved.

The content of the compound (B) with respect to 100 parts by mass of the polysiloxane (A) is preferably no less than 0.1 parts by mass and no greater than 30 parts by mass. When the content of the compound (B) falls within the above-specified range, the pattern collapse resistance and excellence of the pattern configuration of the resist pattern formed on the silicon-containing film provided from the polysiloxane composition is further improved.

The content of the compound (C) with respect to 100 parts by mass of the polysiloxane (A) is preferably no less than 0.1 parts by mass and no greater than 30 parts by mass. When the content of the compound (C) falls within the above-specified range, the pattern collapse resistance and excellence of the pattern configuration of the resist pattern formed on the silicon-containing film provided from the polysiloxane composition is further improved in pattern formation by development with an organic solvent.

It is preferred that the polysiloxane composition further contains water. When the polysiloxane composition further contains water, storage stability is further improved since the polysiloxane (A) is hydrated.

The polysiloxane composition can be suitably used for providing a resist underlayer film due to having the characteristics described above.

A pattern-forming method according to an embodiment of the present invention includes the steps of:

(1) coating the polysiloxane composition according to claim 1 on a substrate to be processed to provide a silicon-containing film;

(2) coating a resist composition on the silicon-containing film to provide a resist coating film;

(3) selectively irradiating with a radioactive ray through a photomask to expose the resist coating film; and (4) developing the exposed resist coating film to form a resist pattern; and (5) sequentially dry etching the silicon-containing film and the substrate to be processed using the resist pattern as a mask.

According to the pattern-forming method, since a resist pattern having superior pattern collapse resistance and an excellent pattern configuration can be formed by using the polysiloxane composition, a desired pattern can be consequently transferred with good reproducibility and fidelity on a substrate to be processed.

In the pattern-forming method, it is preferred that the polysiloxane composition further contains (C) a compound that generates an acid by irradiation with an ultraviolet ray, heating or a combination thereof.

When the polysiloxane composition further contains the compound (C) in the pattern-forming method, a resist pattern having superior pattern collapse resistance and an excellent pattern configuration can be formed even in the case in which a resist pattern is formed by development with an organic solvent; therefore, a desired pattern can be consequently transferred with good reproducibility and fidelity on a substrate to be processed.

As described in the foregoing, according to the polysiloxane composition and the pattern-forming method of the embodiments of the present invention, a resist pattern can be formed that has superior pattern collapse resistance and an excellent pattern configuration while maintaining performances such as a low substrate reflectance, a low residual resist amount, alkaline resistance and oxygen-ashing resistance. In addition, as a result, a desired pattern can be transferred to a substrate to be processed with good reproducibility and fidelity. The embodiments will now be described in detail.

Polysiloxane Composition

The polysiloxane composition contains (A) a polysiloxane and (B) a compound. In addition, the polysiloxane composition may contain (C) a compound, (D) a solvent and (E) water as suitable components. Moreover, the polysiloxane composition may also contain other optional component(s) within a range which does not deteriorate the effects of the present invention. Hereinafter, each constitutive component will be explained.

Polysiloxane (A)

The polysiloxane (A) is a polymer or oligomer having a siloxane bond. The polysiloxane (A) is not particularly limited as long as it has the structure described above, and is exemplified by a hydrolytic condensate of a hydrolyzable silane compound, and the like. Examples of the hydrolyzable silane compound include the compound (S1) described above, a compound (S2) described below, and the like. One, or two or more of these hydrolyzable silane compounds may be used.

The compound (S1) is a compound represented by the above formula (S-1).

In the above formula (S-1), $R^5$ represents a hydrogen atom, an alkyl group having 1 to 5 carbon atoms, a cyano group, an alkenyl group or an aryl group, wherein a part or all of hydrogen atoms included in the alkyl group are not substituted or optionally substituted by a fluorine atom, a cyano group, an aryl group which is unsubstituted or optionally substituted or an alkoxy group having an oxetane ring; X represents a halogen atom or $OR^A$, wherein $R^A$ represents a monovalent organic group; and a is an integer of 0 to 3, wherein in the case in which $R^5$ and X are each present in a plurality of number, a plurality of $R^5$s and Xs are each optionally the same or different.

Examples of the alkyl group having 1 to 5 carbon atoms represented by the $R^5$ include linear alkyl groups such as a methyl group, an ethyl group, a n-propyl group, a n-butyl group and a n-pentyl group; branched alkyl groups such as an isopropyl group, an isobutyl group, a sec-butyl group, a t-butyl group and an isoamyl group, and the like.

Examples of the alkyl group having 1 to 5 carbon atoms substituted with a fluorine atom represented by the $R^5$ include a fluoromethyl group, a difluoromethyl group, a trifluoromethyl group, a fluoroethyl group, a trifluoroethyl group, a perfluoroethyl group, a perfluoropropyl group, a perfluorobutyl group, a perfluoropentyl group, and the like.

Examples of the alkyl group substituted with a cyano group represented by the $R^5$ include a cyanoethyl group, a cyanopropyl group, and the like.

Examples of the alkyl group substituted with an aryl group which is unsubstituted or optionally substituted represented by the $R^5$ include a benzyl group, a phenethyl group, a phenylpropyl group, a methylbenzyl group, an ethylbenzyl group, a methoxybenzyl group, a phenoxybenzyl group, an aminobenzyl group, a dimethylaminobenzyl group, an acetylaminobenzyl group, and the like.

Examples of the alkyl group having 1 to 5 carbon atoms substituted with an alkoxy group having an oxetane ring represented by the $R^5$ include a 3-alkyl-substituted-3-oxeta-nylalkoxyalkyl group, a 2-alkyl-substituted-3-oxetanylalkoxyalkyl group, a 3-oxetanylalkoxyalkyl group, and the like.

Examples of the alkenyl group represented by the $R^5$ include a vinyl group, an allyl group, a methallyl group, a butenyl group, a pentenyl group, a hexenyl group, and the like. Among these, a group represented by the following formula (a) is preferred.

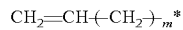  (a)

In the above formula (a), m is an integer of 0 to 4; and "*" denotes a binding site to a silicon atom.

The "m" is preferably 0 or 1, and more preferably 0.

Examples of the aryl group represented by the $R^5$ include a phenyl group, a naphthyl group, a methylphenyl group, an ethylphenyl group, a chlorophenyl group, a bromophenyl group, a fluorophenyl group, and the like. Of these, a phenyl group, and a methylphenyl group are preferred.

Among these, the $R^5$ represents preferably an unsubstituted alkyl group, an alkyl group substituted with an alkoxy group having an oxetane ring, or an aryl group, more preferably an alkyl group having 1 to 3 carbon atoms, a 3-alkyl-substituted-3-oxetanylalkoxyalkyl group, or a substituted or unsubstituted phenyl group are more preferred, and still more preferably a methyl group, a 3-ethyl-3-oxetanylmethoxypropyl group, a phenyl group, or a methylphenyl group.

Examples of the halogen atom represented by the X include a fluorine atom, a chlorine atom, a bromine atom, an iodine atom, and the like.

Examples of the monovalent organic group represented by $R^A$ in $OR^A$ as the X include an alkyl group, an aryl group, an alkylcarbonyl group, and the like.

Examples of the alkyl group include a methyl group, an ethyl group, a n-propyl group, an i-propyl group, a n-butyl group, an i-butyl group, a sec-butyl group, a t-butyl group, and the like.

Examples of the aryl group include a phenyl group, a naphthyl group, and the like.

Examples of the alkylcarbonyl group include a methylcarbonyl group, an ethylcarbonyl group, a propylcarbonyl group, a butylcarbonyl group, and the like.

In light of the hydrolytic condensation reaction of the compound (S1) capable of proceeding at an appropriate rate, the X represents, among these, preferably $OR^A$, more preferably an alkoxy group, and still more preferably a methoxy group or an ethoxy group.

The is preferably an integer of 0 to 2, more preferably 1 or 2, and still more preferably 1.

Examples of the compound (S1) in the case in which a is 0 include tetramethoxysilane, tetraethoxysilane, tetra-n-propoxysilane, tetra-i-propoxysilane, tetra-n-butoxysilane, tetra-sec-butoxysilane, tetra-t-butoxysilane, tetraphenoxysilane, tetrachlorosilane, and the like.

Examples of the compound (S1) in the case in which a is 1 include:

aromatic ring-containing silanes such as phenyltrimethoxysilane, benzyltrimethoxysilane, phenethyltrimethoxysilane, 4-methylphenyltrimethoxysilane, 4-ethylphenyltrimethoxysilane, 4-methoxyphenyltrimethoxysilane, 4-phenoxyphenyltrimethoxysilane, 4-hydroxyphenyltrimethoxysilane, 4-aminophenyltrimethoxysilane, 4-dimethylaminophenyltrimethoxysilane, 4-acetylaminophenyltrimethoxysilane, 3-methylphenyltrimethoxysilane, 3-ethylphenyltrimethoxysilane, 3-methoxyphenyltrimethoxysilane, 3-phenoxyphenyltrimethoxysilane, 3-hydroxyphenyltrimethoxysilane, 3-aminophenyltrimethoxysilane, 3-dimethylaminophenyltrimethoxysilane, 3-acetylaminophenyltrimethoxysilane, 2-methylphenyltrimethoxysilane, 2-ethylphenyltrimethoxysilane, 2-methoxyphenyltrimethoxysilane, 2-phenoxyphenyltrimethoxysilane, 2-hydroxyphenyltrimethoxysilane, 2-aminophenyltrimethoxysilane, 2-dimethylaminophenyltrimethoxysilane, 2-acetylaminophenyltrimethoxysilane, 2,4,6-trimethylphenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane and 4-acetylaminobenzyltrimethoxysilane;

alkyl group-containing silanes such as methyltrimethoxysilane, methyltriethoxysilane, methyltri-n-propoxysilane, methyltri-i-propoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methylsilane, methyltris(methylethylketoxime)silane, methyltris(dimethylsiloxy)silane, methyltris(methoxyethoxy)silane, methyltris(trimethylsiloxy)silane, ethyltrimethoxysilane, ethyltriethoxysilane, ethyltri-n-propoxysilane, ethyltri-i-propoxysilane, ethyltri-n-butoxysilane, ethyltri-sec-butoxysilane, ethyltri-t-butoxysilane, ethyltriphenoxysilane, ethyldichlorosilane, ethyltriacetoxysilane, ethyltrichlorosilane, ethyltris(trimethylsiloxy)silane, n-propyltrimethoxysilane, n-propyltriethoxysilane, n-propyltri-n-propoxysilane, n-propyltri-i-propoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, i-propyltrimethoxysilane, i-propyltriethoxysilane, i-propyltri-n-propoxysilane, i-propyltri-i-propoxysilane, i-propyltri-n-butoxysilane, i-propyltri-sec-butoxysilane, i-propyltri-t-butoxysilane, i-propyltriphenoxysilane, n-butyltrimethoxysilane, n-butyltriethoxysilane, n-butyltri-n-propoxysilane, n-butyltri-i-propoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltri-i-propoxysilane, 2-methylpropyltri-n-butoxysilane, 2-methylpropyltri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltri-i-propoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltri-i-propoxysilane, t-butyltri-n-butoxysilane, t-butyltri-sec-butoxysilane, t-butyltri-t-butoxysilane, t-butyltriphenoxysilane, t-butyltrichlorosilane and t-butyldichlorosilane;

alkenyl group-containing silanes such as vinyltrimethoxysilane, vinyltriethoxysilane, vinyltri-n-propoxysilane, vinyltri-i-propoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltri-i-propoxysilane, allyltri-n-butoxysilane, allyltri-sec-butoxysilane, allyltri-t-butoxysilane and allyltriphenoxysilane;

oxetane ring-containing silanes such as 3-ethyl-3-oxetanylmethoxypropyltriethoxysilane, 3-ethyl-3-oxetanylmethoxypropyltrimethoxysilane, 3-methyl-3-oxetanylmethoxypropyltrimethoxysilane, 3-methyl-3-oxetanylethoxypropyltrimethoxysilane and 3-ethyl-3-oxetanylmethoxyethyltriethoxysilane, and the like.

Examples of the compound (S1) in the case in which a is 2 include
diphenyldimethoxysilane, di(4-methylphenyl)dimethoxysilane, dimethyldimethoxysilane, diethyldimethoxysilane, diphenyldichlorosilane, di(4-methylphenyl)dichlorosilane, dimethyldichlorosilane, diethyldichlorosilane, and the like.

Examples of the compound (S1) in the case in which a is 3 include
triphenylmethoxysilane, tri(4-methylphenyl)methoxysilane, trimethylmethoxysilane, triethylmethoxysilane, triphenylchlorosilane, tri(4-methylphenyl)chlorosilane, trimethylchlorosilane, triethylchlorosilane, and the like.

Among these, in light of the reactivity and handleability of the substance, phenyltrimethoxysilane, 4-methylphenyltrimethoxysilane, 4-methoxyphenyltrimethoxysilane, 4-methylbenzyltrimethoxysilanemethyltrimethoxysilane, methyltrimethoxysilane, methyltriethoxysilane, methyltri-n-propoxysilane, methyltri-i-propoxysilane, methyltri-n-butoxysilane, methyltri-sec-butoxysilane, ethyltrimethoxysilane, ethyltriethoxysilane, ethyltri-n-propoxysilane, ethyltri-i-propoxysilane, ethyltri-n-butoxysilane, ethyltri-sec-butoxysilane, n-propyltrimethoxysilane, n-propyltriethoxysilane, n-propyltri-n-propoxysilane, n-propyltri-i-propoxysilane, n-propyltri-n-butoxysilane, n-propyltri-sec-butoxysilane, vinyltrimethoxysilane, vinyltriethoxysilane, allyltrimethoxysilane and allyltriethoxysilane are preferred, and phenyltrimethoxysilane, 4-methylphenyltrimethoxysilane, methyltrimethoxysilane and 3-ethyl-3-oxetanylmethoxypropyltriethoxysilane are more preferred.

Moreover, in light of a capability of the polysiloxane composition of providing a silicon-containing film that is superior in dry etching resistance, tetramethoxysilane and tetraethoxysilane are preferred among these.

The compound (S2) is a compound represented by the following formula (S-2).

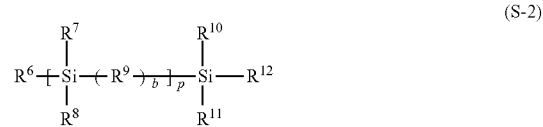

(S-2)

In the above formula (S-2), $R^6$ and $R^{12}$ each independently represent a hydrogen atom, a halogen atom, an alkoxy group, an aryloxy group or an alkylcarbonyloxy group; $R^7$, $R^8$, $R^{10}$ and $R^{11}$ each independently represent a monovalent organic group or a halogen atom; $R^9$ represents an arylene group, a methylene group or an alkylene group having 2 to 10 carbon atoms; b is an integer of 0 to 3, wherein in the case in which $R^9$ is present in a plurality of number, a plurality of $R^9$s are optionally the same or different; and p is an integer of 1 to 20.

Examples of the halogen atom represented by the $R^6$ and $R^{12}$ include a fluorine atom, a chlorine atom, a bromine atom, an iodine atom, and the like.

Examples of the alkoxy group represented by the $R^6$ and $R^{12}$ include a methoxy group, an ethoxy group, a n-propoxy group, an i-propoxy group, a n-butoxy group, a 2-methylpropoxy group, a 1-methylpropoxy group, a t-butoxy group, a n-pentyloxy group, a neopentyloxy group, a n-hexyloxy group, a n-heptyloxy group, a n-octyloxy group, a 2-ethylhexyloxy group, a n-nonyloxy group, a n-decyloxy group, and the like.

Examples of the aryloxy group represented by the $R^6$ and $R^{12}$ include a phenoxy group, a 4-methylphenoxy group, a naphthyloxy group, and the like.

Examples of the alkylcarbonyloxy group represented by the $R^6$ and $R^{12}$ include a methylcarbonyloxy group, an ethylcarbonyloxy group, a propylcarbonyloxy group, and the like.

The $R^6$ and $R^{12}$ represent preferably an alkoxy group, more preferably a methoxy group or an ethoxy group, and still more preferably an ethoxy group.

Examples of the monovalent organic group represented by the $R^7$, $R^8$, $R^{10}$ and $R^{11}$ include an alkyl group, an alkoxy group, an aryl group, an alkenyl group, a group having a cyclic ether structure, and the like. A part or all of hydrogen atoms of the alkyl group are not substituted or optionally substituted by a fluorine atom.

Examples of the alkyl group include a methyl group, an ethyl group, a propyl group, an i-propyl group, a n-butyl group, an i-butyl group, a sec-butyl group, a t-butyl group, and the like. Examples of the alkyl group substituted with a fluorine atom include a fluoromethyl group, a trifluoromethyl group, a fluoroethyl group, a trifluoroethyl group, a perfluoroethyl group, a perfluoro-n-propyl group, a hexafluoro-i-propyl group, and the like.

Examples of the alkoxy group include the same groups exemplified as alkoxy groups which may be represented by the $R^6$ and $R^{12}$, and the like.

Examples of the aryl group include a phenyl group, a naphthyl group, a methylphenyl group, a benzyl group, a phenethyl group, an ethylphenyl group, a chlorophenyl group, a bromophenyl group, a fluorophenyl group, and the like.

Examples of the alkenyl group include a vinyl group, a 1-propenyl group, an allyl group, a 3-butenyl group, a 3-pentenyl group, a 3-hexenyl group, and the like.

Examples of the group having a cyclic ether structure include groups having an oxiranyl group such as an oxiranyl group, a glycidyl group, a glycidyloxy group and a glycidyloxypropyl group; groups having an oxetanyl group such as an oxetanyl group, an oxetanylmethyl group, an oxetanylmethoxy group and a 3-ethyl-3-oxetanylmethoxypropyl group; groups having a tetrahydrofuranyl group such as a tetrahydrofuranyloxy group and a tetrahydrofuranylmethoxy group; groups having a tetrahydropyranyl group such as a tetrahydropyranyloxy group and a tetrahydropyranylmethoxy group, and the like.

The $R^7$, $R^8$, $R^{10}$ and $R^{11}$ represent, among these, preferably an alkyl group, an alkoxy group or an aryl group, more preferably an alkoxy group, still more preferably a methoxy group or an ethoxy group, and particularly preferably an ethoxy group.

Examples of the arylene group represented by the $R^9$ include a phenylene group, a naphthylene group, a methylphenylene group, an ethylphenylene group, a chlorophenylene group, a bromophenylene group, a fluorophenylene group, and the like. Of these, a phenylene group is more preferred.

Examples of the alkylene group having 2 to 10 carbon atoms represented by the $R^9$ include an ethylene group, a propylene group, a butylene group, and the like.

The $R^9$ represents preferably an arylene group, and more preferably a phenylene group.

The "b" is preferably 1 or 2, and more preferably 1.

The "p" is preferably 1 to 15, and more preferably 1 to 10.

Examples of the compound (S2) include:

hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane and 1,1,2,2-tetraphenoxy-1,2-diphenyldisilane;

1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane and 1,2-diphenoxy-1,1,2,2-tetraphenyldisilane;

bis(trimethoxysilyl)methane, bis(triethoxysilyl)methane, bis(tri-n-propoxysilyl)methane, bis(tri-1-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-i-propoxymethylsilyl)-1-(tri-i-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-i-propoxymethylsilyl)-2-(tri-1-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane and 1-(di-t-butoxymethylsilyl)-2-(tri-t-butoxysilyl)ethane;

bis(dimethoxymethylsilyl)methane, bis(diethoxymethylsilyl)methane, bis(di-n-propoxymethylsilyl)methane, bis(di-i-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-i-propoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, bis(dimethylmethoxysilyl)methane, bis(dimethylethoxysilyl)methane, bis(dimethyl-n-propoxysilyl)methane, bis(dimethyl-i-propoxysilyl)methane, bis(dimethyl-n-butoxysilyl)methane, bis(dimethyl-sec-butoxysilyl)methane, bis(dimethyl-t-butoxysilyl)methane, 1,2-bis(dimethylmethoxysilyl)ethane, 1,2-bis(dimethylethoxysilyl)ethane, 1,2-bis(dimethyl-n-propoxysilyl)ethane, 1,2-bis(dimethyl-i-propoxysilyl)ethane, 1,2-bis(dimethyl-n-butoxysilyl)ethane, 1,2-bis(dimethyl-sec-butoxysilyl)ethane and 1,2-bis(dimethyl-t-butoxysilyl)ethane;

1-(dimethoxymethylsilyl)-1-(trimethylsilyl)methane, 1-(diethoxymethylsilyl)-1-(trimethylsilyl)methane, 1-(di-n-propoxymethylsilyl)-1-(trimethylsilyl)methane, 1-(di-i-propoxymethylsilyl)-1-(trimethylsilyl)methane, 1-(di-n-butoxymethylsilyl)-1-(trimethylsilyl)methane, 1-(di-sec-butoxymethylsilyl)-1-(trimethylsilyl)methane, 1-(di-t-butoxymethylsilyl)-1-(trimethylsilyl)methane, 1-(dimethoxymethylsilyl)-2-(trimethylsilyl)ethane, 1-(di-ethoxymethylsilyl)-2-(trimethylsilyl)ethane, 1-(di-n-propoxymethylsilyl)-2-(trimethylsilyl)ethane, 1-(di-i-propoxymethylsilyl)-2-(trimethylsilyl)ethane, 1-(di-n-butoxymethylsilyl)-2-(trimethylsilyl)ethane, 1-(di-sec-butoxymethylsilyl)-2-(trimethylsilyl)ethane, 1-(di-t-butoxymethylsilyl)-2-(trimethylsilyl)ethane;

1,2-bis(trimethoxysilyl)benzene, 1,2-bis(triethoxysilyl)benzene, 1,2-bis(tri-n-propoxysilyl)benzene, 1,2-bis(tri-i-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-i-propoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-i-propoxysilyl)benzene, 1,4-bis(tri-n-butoxysilyl)benzene, 1,4-bis(tri-sec-butoxysilyl)benzene, 1,4-bis(tri-t-butoxysilyl)benzene;

polycarbosilanes such as polydimethoxymethylcarbosilane and polydiethoxymethylcarbosilane, and the like.

Among these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, bis(dimethylmethoxysilyl)methane, bis(dimethylethoxysilyl)methane, 1,2-bis(dimethylmethoxysilyl)ethane, 1,2-bis(dimethylethoxysilyl)ethane, 1-(dimethoxymethylsilyl)-1-(trimethylsilyl)methane, 1-(diethoxymethylsilyl)-1-(trimethylsilyl)methane, 1-(dimethoxymethylsilyl)-2-(trimethylsilyl)ethane, 1-(diethoxymethylsilyl)-2-(trimethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, polydimethoxymethylcarbosilane and polydiethoxymethylcarbosilane are preferred, 1,4-bis(trimethoxysilyl)benzene and 1,4-bis(triethoxysilyl)benzene are more preferred, and 1,4-bis(triethoxysilyl)benzene is still more preferred.

The polysiloxane (A) preferably contains a hydrolytic condensate of the compound (S1) in light of further improvement of the pattern collapse resistance and pattern configuration of the resist pattern formed on the silicon-containing film, and more preferably contains a hydrolytic condensate of the compound (S1) in which the a is 0, with the compound (S1) in which the a is an integer of 1 to 3.

The content of the polysiloxane (A) based on the total solid content of the polysiloxane composition is typically no less than 70% by mass, preferably no less than 80% by mass, and more preferably no less than 90% by mass. One, or two or more types of the polysiloxane (A) may be contained.

Synthesis Method of Polysiloxane (A)

The polysiloxane (A) can be synthesized by, for example, subjecting the hydrolyzable silane compound such as the compound (S1) or the compound (S2) to hydrolytic condensation according to a well-known method.

The polystyrene equivalent weight average molecular weight (Mw) of the polysiloxane (A) as determined by gel permeation chromatography (GPC) is typically no less than 1,000, preferably 2,000 to 100,000, more preferably 2,000 to 50,000, still more preferably 2,000 to 30,000, and particularly preferably 2,000 to 10,000.

It is to be noted that the Mw of the polysiloxane (A) herein is a value determined by GPC under the following conditions.
GPC columns: G2000HXL×2, G3000HXL×1, G4000HXL×1 (manufactured by Tosoh Corporation);
elution solvent: tetrahydrofuran;
flow rate: 1.0 mL/min;
column temperature: 40° C.; and
standard substance: mono-dispersed polystyrene.

Compound (B)

The compound (B) is a nitrogen-containing compound having a nitrogen-containing heterocyclic ring structure, and a polar group, an ester group or a combination thereof. When the polysiloxane composition contains the compound (B), the pattern collapse resistance of the resist pattern formed on the silicon-containing film is improved, and a more excellent pattern configuration is obtained. Although the reason for achieving the aforementioned effects due to the polysiloxane composition containing the compound (B) is not necessarily clear, it is believed that, for example, the presence of the compound (B) in the silicon-containing film of the underlayer of the resist coating film suppresses diffusion of an acid within the resist coating film through the silicon-containing film during PEB. This effect is remarkable as compared with amine compounds not having both a polar group and an ester group. With regard to the reason for such remarkableness, it is believed that the effect is sufficiently achieved since the compound (B) having a polar group and/or an ester group remains in the silicon-containing film due to inhibition of sublimation thereof during baking for providing the silicon-containing film. In addition, it is believed that when the compound (B) has a nitrogen-containing heterocyclic ring structure in the polysiloxane composition, the storage stability is improved.

Examples of the nitrogen-containing heterocyclic ring structure include:

aliphatic heterocyclic ring structures such as a pyrrolidine structure, a piperidine structure, a morpholine structure, a piperazine structure, a homopiperazine structure, a 1,4,7-triazacyclononane structure and a 1,4,7,10-tetraazacyclododecane structure;

aromatic heterocyclic ring structures such as an imidazole structure, a benzimidazole structure, an indole structure, an isoindole structure, a purine structure, a b-one-purine structure, a pyrazole structure, a pyrrole structure, a pyridine structure, a pyrimidine structure, a pyridazine structure, an indolizine structure, a quinolizine structure, a quinoline structure, an isoquinoline structure, a carbazole structure, an acridine structure, a phenazine structure, a phenoxazine structure and a triazine structure, and the like.

Among these, a piperidine structure, a pyrrolidine structure, an imidazole structure, a benzoimidazole structure and a triazine structure are preferred, and a piperidine structure and a pyrrolidine structure are more preferred.

Examples of the polar group include a hydroxyl group, a carboxyl group, a cyano group, an oxetanyl group, and the like. Among these, a hydroxyl group and a carboxyl group are preferred, and a hydroxyl group is more preferred.

Examples of the ester group include an alkyl ester group, a cycloalkyl ester group, an aryl ester group, and the like. Among these, an alkyl ester group and a cycloalkyl ester group are preferred, and it is more preferred that the group represented by the above formula (i) be bonded to a nitrogen atom. The compound (B) having a structure in which the group represented by the above formula (i) is bonded to a nitrogen atom is a compound that generates a basic amino group by an action of an acid via dissociation of a —CR$^1$R$^2$R$^3$ group; therefore, the polysiloxane composition containing the compound has an advantage of being superior in storage stability even if it is in the state of a solution.

In the above formula (i), R$^1$, R$^2$ and R$^3$ each independently represent an alkyl group having 1 to 4 carbon atoms or a monovalent alicyclic hydrocarbon group having 4 to carbon atoms, wherein, R$^1$ and R$^2$ may taken together represent a bivalent alicyclic hydrocarbon group having 4 to 12 carbon atoms together with the carbon atom to which R$^1$ and R$^2$ bond; and "*" denotes a binding site to a nitrogen atom.

Examples of the alkyl group having 1 to 4 carbon atoms represented by the R$^1$, R$^2$ and R$^3$ include a methyl group, an ethyl group, a n-propyl group, an i-propyl group, a n-butyl group, an i-butyl group, and the like.

Examples of the monovalent alicyclic hydrocarbon group having 4 to 12 carbon atoms represented by the R$^1$, R$^2$ and R$^3$ include monocyclic formula cycloalkanes such as cyclobutane, cyclopentane, cyclohexane, cyclooctane and cyclodecane; groups derived by removing one hydrogen atom included in a bridged cycloalkane and the like such as norbornane, tricyclodecane, tetracyclododecane and adamantane, and the like. In addition, examples of the bivalent alicyclic hydrocarbon group having 4 to 12 carbon atoms represented by the R$^1$ and R$^2$ taken together with the carbon atom to which R$^1$ and R$^2$ bond include groups derived by removing one hydrogen atom bonded to the carbon atom at a binding site of the monovalent alicyclic hydrocarbon group having 4 to 12 carbon atoms represented by the R$^1$, R$^2$ and R$^3$, and the like.

Examples of the monovalent group represented by —CR$^1$R$^2$R$^3$ in the above formula (i) include branched alkyl groups such as a t-butyl group, a t-amyl group, a 1-ethyl-1-methylpropyl group and a 1,1-diethyl propyl group, groups represented by the following formulae (p-1) to (p-15), and the like. Among these, a t-butyl group and a t-amyl group are preferred in light of the ease of synthesis of the compound (B).

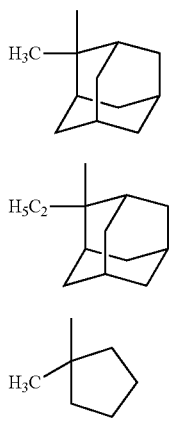

(p-1)

(p-2)

(p-3)

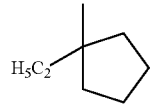

(p-4)

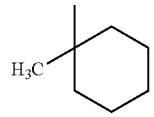

(p-5)

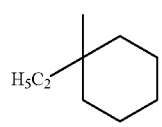

(p-6)

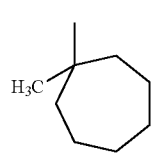

(p-7)

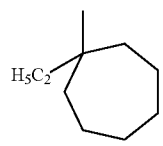

(p-8)

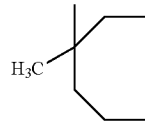

(p-9)

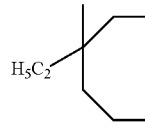

(p-10)

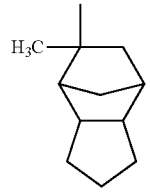

(p-11)

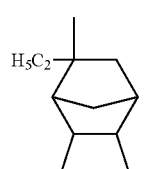

(p-12)

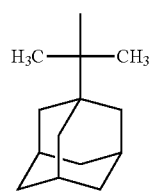

(p-13)

(p-14)

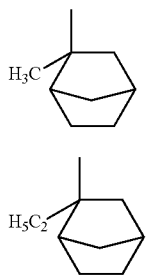

(p-15)

In the case in which the compound (B) is a compound having the nitrogen-containing heterocyclic ring structure, the polar group and the ester group may directly bond to a nitrogen-containing heterocyclic ring, or may bond to the nitrogen-containing heterocyclic ring via a linking group. The linking group is exemplified by bivalent hydrocarbon groups having 1 to 20 carbon atoms which may have —O—, —CO—, —NH—, —SO$_2$— or the like between carbon and carbon, or carbon and hydrogen, and the like.

The compound (B) is exemplified by the compound represented by the above formula (1) (hereinafter, may be also referred to as "compound (1)"), a compound having a polar group but not having an ester group (hereinafter, may be also referred to as "compound (2)"), a nitrogen-containing compound having an ester group bonded to a nitrogen atom but not having a polar group (hereinafter, may be also referred to as "compound (3)"), and the like.

In the above formula (1), $R^1$, $R^2$ and $R^3$ are as defined in the above formula (i); Z represents a group having a valency of (n+2) and representing a heterocyclic ring structure together with a nitrogen atom; A represents a single bond or a bivalent hydrocarbon group having 1 to 8 carbon atoms; $R^4$ represents a hydroxyl group or a carboxyl group; n is an integer of 1 to 6, wherein in the case in which A and $R^4$ are each present in a plurality of number, a plurality of As and $R^4$s are optionally the same or different.

Examples of the bivalent hydrocarbon group having 1 to 8 carbon atoms represented by the A include: bivalent chain hydrocarbon groups such as a methylene group, an ethylene group, a n-propylene group, a n-butylene group, a n-hexylene group and a n-octylene group; bivalent alicyclic hydrocarbon groups derived by removing one hydrogen atom from the carbon atom other than the carbon atom at the binding site of the monovalent alicyclic hydrocarbon group represented by the $R^1$, $R^2$ and $R^3$, and the like.

The "n" is preferably 1 or 2, and more preferably 1.

Examples of the compound (1) include compounds represented by the following formulae (1-1) to (1-5), and the like.

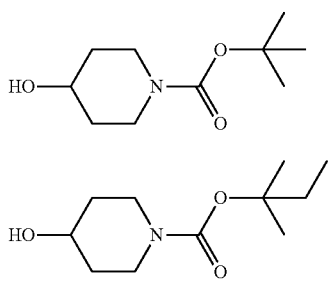

(1-1)

(1-2)

(1-3)

(1-4)

(1-5)

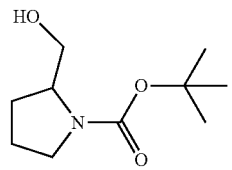

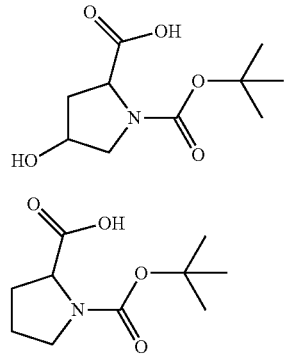

Among these, compounds represented by the above formulae (1-1), (1-2), (1-4) and (1-5) are preferred.

Examples of the compound (2) include compounds represented by the following formulae (2-1) to (2-4), and the like.

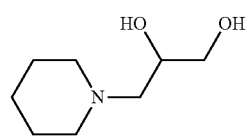

(2-1)

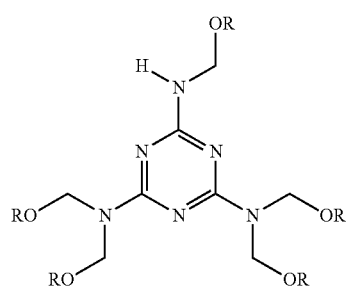

(2-2)

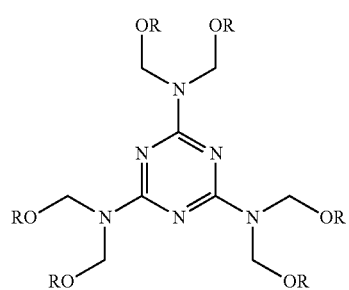

(2-3)

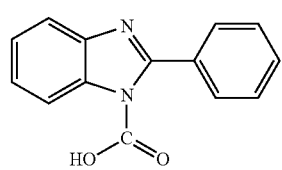

(2-4)

In the above formulae (2-2) and (2-3), R each independently represents a hydrogen atom or a hydrocarbon group having 1 to 4 carbon atoms, wherein, among a plurality of Rs in each formula, at least one is a hydrogen atom.

Among these, the compound represented by the above formula (2-1) is preferred.

Examples of the compound (3) include compounds represented by the following formulae (3-1) to (3-3), and the like.

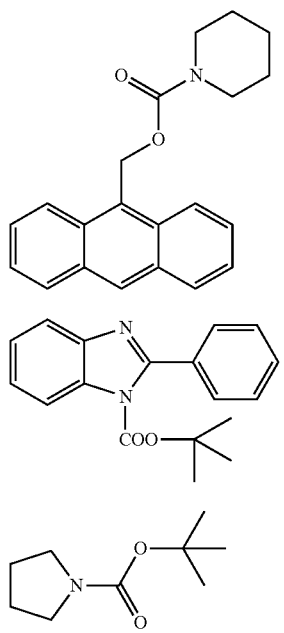

(3-1)

(3-2)

(3-3)

Among these, the compound represented by the above formula (3-1) is preferred.

The compound (B) is preferably the compound (1) and the compound (2), and more preferably the compound (1).

The content of the compound (B) in the polysiloxane composition is, in light of making the pattern configuration of the formed resist pattern more excellent, typically no less than 0.1 parts by mass and no greater than 30 parts by mass, preferably no less than 1 part by mass and no greater than 30 parts by mass, and more preferably no less than 1 part by mass and no greater than 10 parts by mass with respect to 100 parts by mass of the polysiloxane (A). It is to be noted that the compound (B) may be used either alone, or in combination of two or more thereof.

Compound (C)

The compound (C) is a compound that generates an acid by irradiation with an ultraviolet ray, heating or a combination thereof. The polysiloxane composition further containing the compound (C) in addition to the compound (B) described above enables a resist pattern having superior pattern collapse resistance and an excellent pattern configuration to be formed on the silicon-containing film provided in the case of not only resist pattern formation in which development with an alkali is employed, but also development with an organic solvent. Although the reason for achieving the effect described above due to further containing the compound (C) in the polysiloxane composition is not necessarily clear, it is considered that, for example, the resist pattern formed by development with an organic solvent is configured with, e.g., a polymer having a polar group such as a carboxyl group, etc., whereby an interaction occurs with an acid being generated due to an exposure light in forming a resist pattern from the compound (C) and/or generated during baking when providing a silicon-containing film, and being present in the silicon-containing film.

Examples of the compound (C) include onium salt compounds such as a sulfonium salt, a tetrahydrothiophenium salt and an iodonium salt, N-sulfonyloxyimide compounds, organic halogen compounds, sulfone compounds such as disulfones and diazomethanesulfones, and the like.

Examples of the sulfonium salt include: triphenylsulfonium salts such as triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[$4.4.0.1^{2,5}.1^{7,10}$]dodecanyl)-1,1-difluoroethanesulfonate, triphenylsulfonium N,N'-bis(nonafluoro-n-butanesulfonyl)imidate, triphenylsulfonium salicylate, triphenylsulfonium camphorsulfonate and triphenylsulfonium tricyclo[$3.3.1.1^{3,7}$]decanyldifluoromethanesulfonate;

4-cyclohexylphenyldiphenylsulfonium salts such as 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-(3-tetracyclo[$4.4.0.1^{2,5}.1^{7,10}$]dodecanyl)-1,1-difluoroethanesulfonate, 4-cyclohexylphenyldiphenylsulfonium N,N'-bis(nonafluoro-n-butanesulfonyl)imidate and 4-cyclohexylphenyldiphenylsulfonium camphorsulfonate;

4-t-butylphenyldiphenylsulfonium salts such as 4-t-butylphenyldiphenylsulfonium trifluoromethanesulfonate, 4-t-butylphenyldiphenylsulfonium nonafluoro-n-butanesulfonate, 4-t-butylphenyldiphenylsulfonium perfluoro-n-octanesulfonate, 4-t-butylphenyldiphenylsulfonium 2-bicyclo[2.2.1]hept-2-yl-1,1,2,2-tetrafluoroethanesulfonate, 4-t-butylphenyldiphenylsulfonium 2-(3-tetracyclo[$4.4.0.1^{2,5}.1^{7,10}$]dodecanyl)-1,1-difluoroethanesulfonate, 4-t-butylphenyldiphenylsulfonium N,N'-bis(nonafluoro-n-butanesulfonyl)imidate and 4-t-butylphenyldiphenylsulfonium camphorsulfonate;

tri(4-t-butylphenyl)sulfonium salts such as tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium 2-bicyclo[2.2.1]hept-2-yl-1,1,2,2-tetrafluoroethanesulfonate, tri(4-t-butylphenyl)sulfonium 2-(3-tetracyclo[$4.4.0.1^{2,5}.1^{7,10}$]dodecanyl)-1,1-difluoroethanesulfonate, tri(4-t-butylphenyl)sulfonium N,N'-bis(nonafluoro-n-butanesulfonyl)imidate and tri(4-t-butylphenyl)sulfonium camphorsulfonate, and the like.

Examples of the tetrahydrothiophenium salt include:
1-(4-n-butoxynaphthalen-1-yl)tetrahydrothiophenium salts such as 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium 2-(3-tetracyclo[$4.4.0.1^{2,5}.1^{7,10}$]dodecanyl)-1,1-difluoroethanesulfonate, 1-(4-n-butoxynaphthalen-1-yl)tetrahydrothiophenium N,N'-bis(nonafluoro-n-butanesulfonyl)imidate and 1-(4-n-butoxynaphthalen-1-yl)tetrahydrothiophenium camphorsulfonate;

1-(3,5-dimethyl-4-hydroxyphenyl)tetrahydrothiophenium salts such as 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium 2-(3-tetracyclo[4.4.0.1$^{2,5}$.1$^{7,10}$]dodecanyl)-1,1-difluoroethanesulfonate, 1-(3,5-dimethyl-4-hydroxyphenyl)tetrahydrothiophenium N,N'-bis(nonafluoro-n-butanesulfonyl)imidate and 1-(3,5-dimethyl-4-hydroxyphenyl)tetrahydrothiophenium camphorsulfonate, and the like.

Examples of the iodonium include:

diphenyliodonium salts such as diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium 2-(3-tetracyclo[4.4.0.1$^{2,5}$.1$^{7,10}$]dodecanyl)-1,1-difluoroethanesulfonate, diphenyliodonium N,N'-bis(nonafluoro-n-butanesulfonyl)imidate and diphenyliodonium camphorsulfonate;

bis(4-t-butylphenyl)iodonium salts such as bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium 2-(3-tetracyclo[4.4.0.1$^{2,5}$.1$^{7,10}$]dodecanyl)-1,1-difluoroethanesulfonate, bis(4-t-butylphenyl)iodonium N,N'-bis(nonafluoro-n-butanesulfonyl)imidate and bis(4-t-butylphenyl)iodonium camphorsulfonate, and the like.

Examples of the N-sulfonyloxyimide compound include:

N-sulfonyloxysuccinimidessuch as N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)succinimide and N-(camphorsulfonyloxy)succinimide;

bicyclo[2.2.1]hept-5-ene-2,3-dicarboxylmides such as N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxylmide and N-(camphorsulfonyloxy)bicyclo[2.2.1]hept-5-ene-2,3-dicarboxylmide, and the like.

Among these, the compound (C) is preferably an onium salt compound, more preferably a sulfonium salt and an iodonium salt, still more preferably a triphenylsulfonium salt and a bis(4-t-butylphenyl)iodonium salt, and particularly preferably triphenylsulfonium trifluoromethanesulfonate, triphenylsulfonium tricyclo[3.3.1.1$^{3,7}$]decanyldifluoromethanesulfonate and bis(4-t-butylphenyl)iodonium trifluoromethanesulfonate. The compound (C) may be used either alone or in combination of two or more thereof.

The content of the compound (C) in the polysiloxane composition is, in light of making the pattern configuration of the resist pattern formed more excellent, preferably no less than 0.1 parts by mass and no greater than 30 parts by mass, more preferably no less than 0.1 parts by mass and no greater than 20 parts by mass, and still more preferably no less than 0.1 parts by mass and no greater than 10 parts by mass with respect to 100 parts by mass of the polysiloxane (A).

Solvent (D)

As the solvent (D), any solvent can be used as long as it can dissolve or disperse the polysiloxane (A), the compound (B) and optional component(s) contained as needed.

The solvent (D) is exemplified by an alcohol solvent, an ether solvent, a ketone solvent, an ester solvent, an amide solvent, a hydrocarbon solvent, and the like.

Examples of the alcohol solvent include:

monoalcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethyl nonyl alcohol, sec-tetradecyl alcohol, sec-heptadecyl alcohol, furfuryl alcohol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether solvent include:

aliphatic ether solvents such as diethyl ether, dipropyl ether and dibutyl ether;

aromatic ether solvents such as diphenyl ether and anisole;

cyclic ether solvents such as tetrahydrofuran and dioxane, and the like.

Examples of the ketone solvent include:

aliphatic ketone solvents such as acetone, methyl ethyl ketone, methyl-n-propyl ketone, methyl-n-butyl ketone, diethyl ketone, methyl-iso-butyl ketone, methyl-n-pentyl ketone, ethyl-n-butyl ketone, methyl-n-hexyl ketone, di-iso-butyl ketone, trimethyl nonanone, 2,4-pentanedione and acetonyl acetone;

aromatic ketone solvents such as acetophenone and ethyl phenyl ketone;

cyclic ketone solvents such as cyclopentanone, cyclohexanone, cycloheptanone, cyclooctanone and methylcyclohexanone, and the like.

Examples of the amide solvent include:

linear amide solvents such as N-methylformamide, N,N-dimethylformamide, N,N-diethylformamide, acetamide, N-methylacetamide, N,N-dimethylacetamide and N-methylpropionamide;

cyclic amide solvents such as N-methylpyrrolidone and N,N'-dimethylimidazolidinone, and the like.

Examples of the ester solvent include:

monocarboxylic acid monoester solvents such as methyl acetate, ethyl acetate, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, acetomethyl acetate, acetoethyl acetate, ethyl propionate, n-butyl propionate, iso-amyl propionate, methyl lactate, ethyl lactate, n-butyl lactate and n-amyl lactate;

dicarboxylic acid diester solvents such as diethyl oxalate, di-n-butyl oxalate, diethyl malonate, dimethyl phthalate and diethyl phthalate;

polyhydric alcohol diester solvents such as diacetate ethylene glycol and diacetate propylene glycol;

polyhydric alcohol partial ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate and methoxytriglycol acetate;

lactone solvents such as γ-butyrolactone and γ-valerolactone;

carbonate solvents such as diethyl carbonate and propylene carbonate, and the like.

Examples of the hydrocarbon solvent include:

aliphatic hydrocarbon solvents such as n-pentane, iso-pentane, n-hexane, iso-hexane, n-heptane, iso-heptane, 2,2,4-trimethyl pentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene, and the like.

Among these, an alcohol solvent and an ester solvent are preferred; a polyhydric alcohol partial ether solvent and a polyhydric alcohol partial ether acetate solvent are more preferred; and propylene glycol monoethyl ether, propylene glycol monopropyl ether and propylene glycol monomethyl ether acetate are still more preferred. The Solvent (D) may be used alone or as a mixture of two or more thereof.

It is to be noted that the solvent (D) has a content of an alcohol having a boiling point of no greater than 100° C. of preferably no greater than 20% by mass, and more preferably no greater than 5% by mass. The alcohol having a boiling point of no greater than 100° C. may be generated during the hydrolytic condensation of the silane compound such as the compound (S1) and the compound (S2), and the content of such an alcohol is preferably removed by distillation or the like so as to fall within the above range.

Water (E)

When the polysiloxane composition contains water, the polysiloxane (A) is hydrated, whereby the storage stability is improved. In addition, when the polysiloxane composition contains water, curing in providing a film from the polysiloxane composition is promoted, thereby enabling a compact film to be obtained. The content of water contained in the polysiloxane composition is preferably 0 to 30 parts by mass, more preferably 0.1 to 20 parts by mass, and still more preferably 0.2 to 10 parts by mass with respect to 100 parts by mass of the solvent (D). Also, the water content in the polysiloxane composition is preferably 0 to 30% by mass, more preferably 0.1 to 20% by mass, and still more preferably 0.2 to 10% by mass. When the content of water is too great, the storage stability of the polysiloxane composition, and uniformity of the provided silicon-containing film may be deteriorated.

Other Optional Component

The polysiloxane composition may contain in addition to the components (A) to (E), for example, β-diketone, colloidal silica, colloidal alumina, an organic polymer, a surfactant, a base generating agent, and the like as other optional component. The polysiloxane composition may contain the other optional component of one type, or two or more types.

When the polysiloxane composition contains β-diketone, coating properties and storage stability are improved. Examples of the β-diketone include acetyl acetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like. The content of the β-diketone in the polysiloxane composition is preferably no greater than 66 parts by mass, and more preferably no greater than 42% by mass with respect to 100 parts by mass of the solvent (D). When the polysiloxane composition has the content of the β-diketone falling within the above range, a certain storage stability can be attained, and probability of impairment of characteristics such as uniformity of the coating film can be reduced. The β-diketone may be used either alone or in combination of two or more thereof.

The colloidal silica is a dispersion liquid prepared by dispersing anhydrous silicic acid having a high purity in a hydrophilic organic solvent, in which the mean particle diameter is usually 5 to 30 nm, and preferably 10 to 20 nm, with a solid content concentration of about 10 to 40% by mass. Examples of the colloidal silica include methanol silica sol, isopropanol silica sol (both manufactured by Nissan Chemical Industries, Ltd.); Oscar (manufactured by Catalysts & Chemicals Industries Co., Ltd.), and the like.

Examples of the colloidal alumina include alumina sol 520, alumina sol 100 and alumina sol 200 (all manufactured by Nissan Chemical Industries, Ltd.); alumina clear sol, alumina sol 10 and alumina sol 132 (all manufactured by Kawaken Fine Chemicals Co., Ltd.), and the like.

The organic polymer is exemplified by compounds having a polyalkyleneoxide structure, compounds having a carbohydrate chain structure, vinylamide polymers, acrylate compounds, methacrylate compounds, aromatic vinyl compounds, dendrimers, polyimides, polyamic acids, polyarylenes, polyamides, polyquinoxalines, polyoxadiazoles, fluorine polymers, and the like.

The surfactant is exemplified by nonionic surfactants, anionic surfactants, cationic surfactants, amphoteric surfactants, silicone surfactants, polyalkyleneoxide surfactants, fluorine-containing surfactants, and the like.

The base generating agent is a compound that generates a base by carrying out a heating treatment or an exposure treatment. Examples of the base generating agent include triphenylsulfonium compounds; triphenyl methanol; photoactive carbamates such as benzyl carbamate and benzoin carbamate; amides such as o-carbamoylhydroxylamide, o-carbamoyloxime, aromatic sulfoneamide, alpha lactam and N-(2-allylethynyl)amide; oxime esters, α-aminoacetophenone, cobalt complexes, and the like.

Preparation Method of Polysiloxane Composition

The polysiloxane composition may be prepared by, for example, mixing the polysiloxane (A) and the compound (B), and optional component(s) as needed, and dissolving or dispersing the mixture in the organic solvent (D). The solid content concentration of the polysiloxane composition is typically 0.5% by mass to 20% by mass, and preferably 1% by mass to 15% by mass.

The intended usage of the polysiloxane composition is not particularly limited, and may be used as materials for providing films such as interlayer insulating films, protective films and antireflective films. In particular, silicon-containing films obtained from the polysiloxane composition has high adhesiveness to resist coating films and other underlayer films (including antireflective films), and by using the silicon-containing film, resist patterns having a superior bottom shape with reduced tailing, etc., can be obtained on the film. Thus, the polysiloxane composition can be suitably used as a composition for providing a resist underlayer film in, for example, pattern-forming methods in which a multilayer resist process is used such as the pattern-forming method described later, and can be particularly suitably used in pattern-forming methods in which a multilayer resist process is used within a finer range of less than 90 nm (ArF, ArF in liquid immersion lithography, EUV, nanoimprint).

The silicon-containing film as the resist underlayer film can be provided by coating the polysiloxane composition on, for example, the surface of other underlayer film (antireflective film) or the like to provide a coating film, and subjecting the coating film to a heat treatment to allow for curing.

As a method for coating the polysiloxane composition, for example, a spin coating method, a roll coating method, a dipping method, and the like may be exemplified. The temperature of heating the provided coating film is typically 50 to 450° C. The film thickness of the silicon-containing film obtained after the heat treatment is commonly 10 to 200 nm.

Pattern-Forming Method

The pattern-forming method of one embodiment of the present invention includes:

(1) a step of coating the polysiloxane composition on a substrate to be processed to provide a silicon-containing film (hereinafter, may be also referred to as "step (1)");

(2) a step of coating a resist composition on the silicon-containing film to provide a resist coating film (hereinafter, may be also referred to as "step (2)");

(3) a step of selectively irradiating with a radioactive ray through a photomask to expose the resist coating film (hereinafter, may be also referred to as "step (3)");

(4) a step of developing the exposed resist coating film to form a resist pattern (hereinafter, may be also referred to as "step (4)"); and (5) a step of sequentially dry etching the silicon-containing film and the substrate to be processed using the resist pattern as a mask (hereinafter, may be also referred to as "step (5)").

According to the pattern-forming method, since a resist pattern having superior pattern collapse resistance and an excellent pattern configuration can be formed by using the polysiloxane composition, a desired pattern can be consequently transferred to a substrate to be processed with good reproducibility and fidelity. Each step will be explained below.

Step (1)

In the step (1), the polysiloxane composition is coated on a substrate to be processed to provide a silicon-containing film.

Examples of the substrate to be processed include insulating films and the like of oxidization silicon, silicon nitride, silicon oxynitride, polysiloxane or the like, and commercially available products of the substrate to be processed include interlayer insulating films such as wafers covered with a low-dielectric insulating film, e.g., Black Diamond (manufactured by AMAT), SiLK (manufactured by Dow Chemical) and LKD5109 (manufactured by JSR Corporation), and the like. As the substrate to be processed, a patterned substrate such as a wiring groove (trench) or a plug groove (via) may be used.

In addition, the substrate to be processed may be provided with other resist underlayer film (i.e., a resist underlayer film that is different from the silicon-containing film obtained from the polysiloxane composition) beforehand. As the other resist underlayer film, for example, in order to further complement functions attained by the silicon-containing film and/or the resist coating film, and/or add function not attained by these films in resist pattern formation, a film to which a certain function required (e.g., antireflecting function, flatness of the coating film, high etching resistance against fluorine gas such as $CF_4$) was imparted, and the like may be exemplified. Commercially available products of the antireflective film as the other resist underlayer film are exemplified by NFC HM8006 (manufactured by JSR Corporation), and the like.

The method for coating the polysiloxane composition is exemplified by a spin coating method, and the like.

The method for providing the silicon-containing film is exemplified by a method of curing the coating film of the polysiloxane composition by exposing and/or heating, and the like.

Examples of the radioactive ray used for the exposure include: electromagnetic waves such as a visible light ray, an ultraviolet ray, a far ultraviolet ray, an X-ray, an electron beam and a γ-ray; particle rays such as a molecular beam and an ion beam, and the like. In addition, the temperature of heating the coating film is preferably 90° C. to 550° C., more preferably 90° C. to 450° C., and still more preferably 90° C. to 300° C.

The film thickness of the silicon-containing film provided is not particularly limited, and is preferably 100 to 20,000 nm.

The surface of the provided silicon-containing film may be subjected to a methylsilylation treatment using a silylation treatment agent or the like for further improving an adhesiveness between the silicon-containing film and the resist coating film.

Examples of the silylation treatment agent include allyloxytrimethylsilane, N,O-bis(trimethylsilyl)acetamide, bis(trimethylsilyl)trifluoroacetamide, bis(trimethylsilyl)urea, trimethylchlorosilane, N-(trimethylsilyl)acetamide, trimethylsilylazido, trimethylsilylcyanamide, N-(trimethylsilyl)imidazole, 3-trimethylsilyl-2-oxazolidinone, trimethylsilyltrifluoromethanesulfonate, hexamethyldisilazane, heptamethyldisilazane, hexamethyldisiloxane, N-methyl-N-trimethylsilyltrifluoroacetamide, (N,N-dimethylamino)trimethylsilane, nonamethyltrisilazane, 1,1,3,3-tetramethyldisilazane, trimethyliodosilane, and the like.

The methylsilylation treatment of the surface of the silicon-containing film may be carried out by, for example, dip coating or spin coating of the silylation treatment agent on the silicon-containing film, exposing the silicon-containing film to an atmosphere of steam of a silylation agent, or the like. Also, after the methylsilylation treatment, the silicon-containing film subjected to the methylsilylation treatment may be heated to 50° C. to 300° C.

Step (2)

In the step (2), a resist coating film is provided by coating a resist composition on the silicon-containing film obtained in the step (1).

The resist composition used is exemplified by a chemically amplified resist composition containing a resin having a solubility in an alkaline developer solution that increases due to an action of an acid, a positive type resist composition containing an alkali-soluble resin and a quinone diazide photosensitizing agent, a negative type resist containing an alkali-soluble resin and a crosslinking agent, and the like. The solid content concentration of the resist composition is preferably 5 to 50% by mass. The resist composition is preferably filtered through a filter having a pore size of about 0.2 μm. It is to be noted that, a resist composition that is a commercially available product may be directly used as such a resist composition in the pattern-forming method.

The method for coating the resist composition on the silicon-containing film is exemplified by conventional methods such as a spin coating method, and the like. It is to be noted that when coating the resist composition, the amount of the resist composition coated is adjusted such that the resulting resist coating film has a predetermined film thickness.

When the resist coating film is provided, a solvent in a coating film provided by coating the resist composition (i.e., solvent contained in the resist composition) may be evaporated by prebaking (PB) the coating film. The temperature of the PB is appropriately adjusted in accordance with the type and the like of the resist composition used, and is preferably 30° C. to 200° C., and more preferably 50° C. to 150° C. The time period of the PB is preferably 5 sec to 600 sec, and more preferably 10 sec to 300 sec.

As the resist pattern-forming method, a double patterning method, a double exposure method or the like that is a procedure of forming a fine pattern may be appropriately employed. In addition, as the resist pattern-forming method, a method for forming a negative pattern using a resist composition containing a resin having a solubility in an alkaline developer solution that increases by an action of an acid, and using an organic solvent as a developer solution disclosed in Japanese Unexamined Patent Application, Publication No. 2008-292975 may be used, and this method and a double exposure method may be used in combination.

Step (3)

In the step (3), the resist coating film is exposed by selectively irradiating the resist coating film obtained in the step (2) with a radioactive ray through a photomask.

The radioactive ray used in the exposure is appropriately selected from electromagnetic waves such as a visible light ray, an ultraviolet ray, a far ultraviolet ray, an X-ray and a γ-ray; particle rays such as an electron beam, a molecular beam and an ion beam, and the like, depending on the type of an acid generating agent used in the resist composition. Among these, a far ultraviolet ray is preferred, and a KrF excimer laser beam (248 nm), an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm) and an extreme ultraviolet ray (wavelength: 13 nm, etc.) are more preferred.

In addition, the method of the exposure is not particularly limited, and a method carried out in conventionally well-known pattern formation may be employed.

It is to be noted that post exposure baking (PEB) is preferably carried out after the exposure. By carrying out the PEB, resolution, pattern profile, developability and the like of the resultant resist pattern can be improved. The temperature of the PEB is appropriately adjusted in accordance with the type and the like of the resist composition used, and preferably 50° C. to 200° C., and more preferably 80° C. to 150° C. The time period of the PEB is preferably 5 sec to 600 sec, and more preferably 10 sec to 300 sec.

Step (4)

In the step (4), a resist pattern is formed by developing the resist coating film exposed in the step (3).

The developer solution used in the development may be appropriately selected in accordance with the type of the resist composition used, and is exemplified by an aqueous alkaline solution of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide (TMAH), tetraethylammonium hydroxide, pyrrole, piperidine, choline, 1,8-diazabicyclo[5.4.0]-7-undecene, 1,5-diazabicyclo[4.3.0]-5-nonene or the like, and the like. Also, a solution prepared by adding a water soluble organic solvent such as an alcohol, e.g., methanol or ethanol, and/or a surfactant in an appropriate amount to the aqueous alkaline solution may be used.

Examples of the developer solution in the case in which the resist composition used is the negative type resist include aqueous solutions of inorganic alkalis such as sodium hydroxide, potassium hydroxide, sodium carbonate, sodium silicate, sodium metasilicate and ammonia water, alkalis e.g., primary amines such as ethylamine and n-propylamine, secondary amines such as diethylamine and di-n-butylamine, tertiary amines such as triethylamine and methyldiethylamine alcohol amines such as dimethyl ethanolamine and triethanolamine, quaternary ammonium salts such as TMAH, tetraethylammonium hydroxide and choline, cyclic amines such as pyrrole and piperidine, and the like.

Examples of the organic solvent as a developer solution for forming the negative pattern include ketone solvents, alcohol solvents, ether solvents, amide solvents, ester solvents, and the like.

Examples of the ketone solvent include aliphatic ketone solvents such as 1-octanone, 2-octanone, 1-nonanone, 2-nonanone, acetone, 4-heptanone, 2-hexanone, diisobutyl ketone, methylethyl ketone and methylisobutyl ketone;

aromatic ketone solvents such as phenylacetone;

cyclic ketone solvents such as cyclohexanone and methylcyclohexanone, and the like.

Examples of the alcohol solvent include linear alcohol solvents such as methyl alcohol, ethyl alcohol, n-propyl alcohol, isopropyl alcohol, n-butyl alcohol, sec-butyl alcohol, t-butyl alcohol, isobutyl alcohol, n-hexyl alcohol, n-heptyl alcohol, n-octyl alcohol and n-decanol;

glycol solvents such as ethylene glycol, diethylene glycol and triethylene glycol;

glycol partial ether solvents such as ethylene glycol monomethyl ether, propylene glycol monomethyl ether, ethylene glycol, propylene glycol, diethylene glycol monomethyl ether, triethylene glycol monoethyl ether and methoxymethyl butanol, and the like.

Examples of the ether solvent include dioxane, tetrahydrofuran, and the like.

Examples of the amide solvent include N-methyl-2-pyrrolidone, N,N-dimethylacetamide, N,N-dimethylformamide, and the like.

Examples of the ester solvent include:

carboxylate esters such as methyl acetate, butyl acetate, ethyl acetate, isopropyl acetate, amyl acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate;

glycol monoether acetate solvents such as propylene glycol monomethyl ether acetate, ethylene glycol monoethyl ether acetate, diethylene glycol monobutyl ether acetate and diethylene glycol monoethyl ether acetate, and the like.

Water may be mixed with the organic solvent.

The organic solvent is preferably an ester solvent, and more preferably butyl acetate. The organic solvent may be used either alone or as a mixture of multiple types.

In the step (4), a predetermined resist pattern corresponding to the photomask can be formed by carrying out the development with the developer solution, followed by washing and drying.

Step (5)

In the step (5), the silicon-containing film and the substrate to be processed are sequentially dry-etched using the resist pattern formed in the step (4) as a mask (etching mask) to form a pattern. It is to be noted that when a substrate to be processed on which other resist underlayer film had been provided is used, the other resist underlayer film is also dry etched together with the silicon-containing film and the substrate to be processed.

The dry etching may be carried out with a well-known dry etching apparatus. Also, as a source gas for use during the dry etching, gas containing an oxygen atom such as $O_2$, CO or $CO_2$; inert gas such as He, $N_2$ or Ar; chlorine based gas such as $Cl_2$ or $BCl_4$; or gas such as $H_2$ or $NH_3$ may be used although it may depend on the elemental composition of the film to be etched. It should be noted that the gas used either alone or as a mixture of two or more types thereof.

By carrying out the step (1) to step (5) in the pattern-forming method, a pattern for certain processing of substrates can be formed. Due to use, as the polysiloxane composition, of the polysiloxane composition further containing the compound (C) in addition to the polysiloxane (A) and the compound (B), a resist pattern that is superior in pattern collapse resistance and has an excellent pattern configuration can be formed on a silicon-containing film not only in the case in which the resist pattern is formed by the development with an alkali but also in the case in which the resist pattern is formed by development with an organic solvent.

EXAMPLES

Hereinafter, the present invention will be explained specifically by way of Examples, but the present invention is not limited thereto. Measurement of the solid content concentration of the solution containing a polysiloxane in the Examples was conducted according to the following method.

Measurement of Solid Content Concentration

A solution containing a polysiloxane in an amount of 0.5 g was heated at 250° C. for 30 min, and the residual mass was measured to determine a mass of the solid content. The solid content concentration (% by mass) in the solution containing a polysiloxane was calculated from the value of the residual mass.

Synthesis of Polysiloxane (A)

Monomers used for synthesizing the polysiloxane (A) are shown below. The structure of each monomer is represented by the following each formula.

Compound (M-1): tetramethoxysilane
Compound (M-2): phenyltrimethoxysilane
Compound (M-3): 3-ethyl-3-oxetanylmethyltrimethoxysilane
Compound (M-4): methyltrimethoxysilane
Compound (M-5): 4-tolyltrimethoxysilane
Compound (M-6): tetraethoxysilane
Compound (M-7): 1,4-bis(triethoxysilyl)benzene

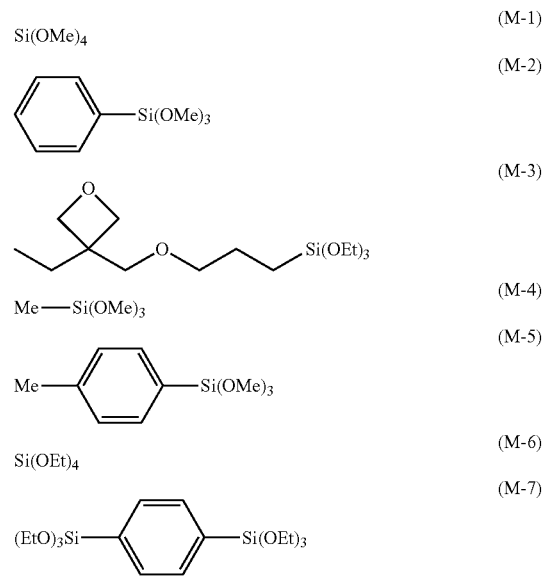

Synthesis Example 1

Synthesis of Polysiloxane (A-1)

Oxalic acid in an amount of 1.28 g was dissolved in 12.85 g of water with heating to prepare an aqueous oxalic acid solution. Thereafter, a flask charged with 25.05 g of the compound (M-1), 3.63 g of the compound (M-2) and 57.19 g of propylene glycol monoethyl ether was fitted with a condenser and a dropping funnel containing the aqueous oxalic acid solution prepared as above. Next, after heating the mixture to 60° C. in an oil bath, the aqueous oxalic acid solution was slowly added dropwise to the mixture, and the mixture was reacted at 60° C. for 4 hours. After completion of the reaction, the flask containing the reaction solution was allowed to cool and fitted with an evaporator. Then methanol generated during the reaction was removed to obtain a solution that includes 97.3 g of (A-1) a polysiloxane.

The solid content concentration in the solution containing the resulting polysiloxane (A-1) was 18.0% by mass. Also, the Mw of the resultant polysiloxane (A-1) was of 2,000.

Synthesis Example 2

Synthesis of Polysiloxane (A-2)

Tetramethylammonium hydroxide in an amount of 2.92 g was dissolved in 8.75 g of water with heating to prepare an aqueous tetramethylammonium hydroxide solution. Thereafter, a flask charged with 11.67 g of the prepared aqueous tetramethylammonium hydroxide solution, 4.53 g of water and 20 g of methanol was fitted with a condenser, a dropping funnel containing 10.65 g of the compound (M-1), 1.98 g of the compound (M-2), 2.72 g of the compound (M-4) and 20 g of methanol. Next, after heating the mixture to 50° C. in an oil bath, the solution of the monomer in methanol was slowly added dropwise, and the mixture was reacted at 50° C. for 2 hrs. After completion of the reaction, the flask containing the reaction solution was allowed to cool.

Thereafter, the cooled reaction solution was added dropwise to 36.67 g of a solution of maleic anhydride in methanol prepared by dissolving 4.39 g of maleic anhydride in 16.14 g of water and 16.14 g of methanol, and the mixture was stirred for 30 min. Next, after adding 50 g of 4-methyl-2-pentenone, the flask was fitted with an evaporator, and the reaction solvent and methanol generated during the reaction were removed to obtain a solution of a polysiloxane in 4-methyl-2-pentenone. The resulting solution was transferred to a separating funnel, and then 80 g of water was added thereto to carry out first washing, followed by second washing carried out by adding 40 g of water thereto. Thereafter, the solution of the polysiloxane in 4-methyl-2-pentenone was transferred from the separating funnel to the flask, and 50 g of propylene glycol monoethyl ether was added thereto. The flask was then fitted with an evaporator to remove 4-methyl-2-pentenone, whereby 51 g of a solution containing (A-2) a polysiloxane. The solid content concentration of the obtained solution containing the polysiloxane (A-2) was 18.0% by mass. In addition, the Mw of the resultant polysiloxane (A-2) was 4,000.

Synthesis Examples 3 to 7, 10 and 11

Synthesis of Polysiloxanes (A-3) to (A-7), (A-10) and (A-11)

Polysiloxanes (A-3) to (A-7), (A-10) and (A-11) were synthesized in a similar manner to Synthesis Example 1 except that each monomer of the type and the amount used as shown in Table 1 below was used.

Synthesis Example 9

Synthesis of Polysiloxanes (A-8) and (A-9)

Polysiloxanes (A-8) and (A-9) were synthesized in a similar manner to Synthesis Example 2 except that each monomer of the type and the amount used as shown in Table 1 below was used.

The Mw of the polysiloxane (A) obtained in each Synthesis Example, and the solid content concentration (% by mass) of the solution containing the polysiloxane (A) are together shown in Table 1 below.

TABLE 1

| (A) Polysiloxane | Monomer type | amount used (mol %) | Mw | Solid content concentration of solution containing polysiloxane (A) (% by mass) |
|---|---|---|---|---|
| Synthesis Example 1 | A-1 | M-1 | 90 | 2,000 | 18 |
| | | M-2 | 10 | | |
| Synthesis Example 2 | A-2 | M-1 | 70 | 4,000 | 18 |
| | | M-2 | 10 | | |
| | | M-4 | 20 | | |
| Synthesis Example 3 | A-3 | M-1 | 20 | 1,600 | 18 |
| | | M-3 | 80 | | |
| Synthesis Example 4 | A-4 | M-1 | 90 | 8,400 | 18 |
| | | M-4 | 10 | | |
| Synthesis Example 5 | A-5 | M-1 | 70 | 1,500 | 18 |
| | | M-2 | 5 | | |
| | | M-4 | 25 | | |
| Synthesis Example 6 | A-6 | M-4 | 100 | 1,800 | 18 |
| Synthesis Example 7 | A-7 | M-1 | 95 | 2,000 | 18 |
| | | M-6 | 5 | | |
| Synthesis Example 8 | A-8 | M-1 | 70 | 4,000 | 18 |
| | | M-4 | 26 | | |
| | | M-5 | 4 | | |
| Synthesis Example 9 | A-9 | M-1 | 70 | 4,000 | 18 |
| | | M-4 | 20 | | |
| | | M-5 | 10 | | |

TABLE 1-continued

| (A) Polysiloxane | Monomer type | amount used (mol %) | Mw | Solid content concentration of solution containing polysiloxane (A) (% by mass) |
|---|---|---|---|---|
| Synthesis Example 10 | A-10 | M-1 | 95 | 2,000 | 18 |
| | | M-2 | 5 | | |
| Synthesis Example 11 | A-11 | M-1 | 80 | 4,000 | 18 |
| | | M-4 | 10 | | |
| | | M-7 | 10 | | |

Preparation of Polysiloxane Composition

The components other than the polysiloxane (A) constituting the polysiloxane composition are shown below.
Compound (B)
Each structure is represented by the following formula.
B-1: N-t-amyloxycarbonyl-4-hydroxypiperidine
B-2: N-t-butoxycarbonyl-4-hydroxypiperidine
B-3: N-t-butoxycarbonyl-3-hydroxy-5-carboxypyrrolidine
B-4: N-t-butoxycarbonyl-2-carboxypyrrolidine
B-5: N-2,3-dihydroxypropylpiperidine
B-6: N-9-anthranilmethyloxycarbonylpiperidine
b-1: N,N',N'',N'''-tetrabutoxyglycoluril
b-2: 3,12-dihydroxy-24-nor-5β-cholanoic-23-acid t-butoxycarbonylmethyl ester

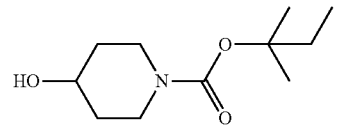

(B-1)

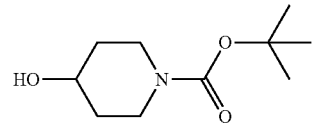

(B-2)

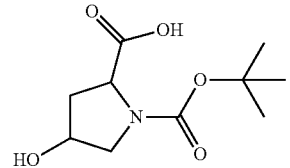

(B-3)

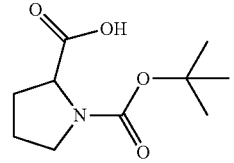

(B-4)

(B-5)
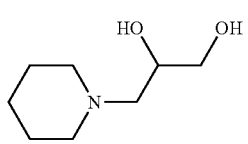

(B-6)
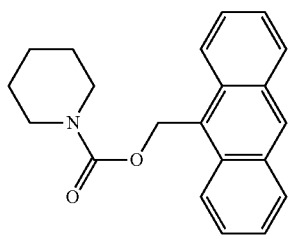

(b-1)
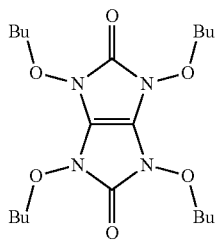

(b-2)
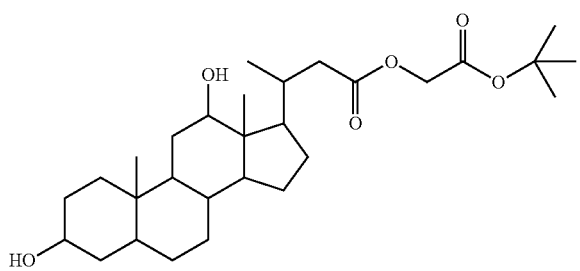

Compound (C)

Each structure is represented by the following each formula.

C-1: triphenylsulfonium trifluoromethanesulfonate

C-2: triphenylsulfonium tricyclo[3.3.1.1$^{3,7}$]decanyldifluoromethanesulfonate C-3: bis(4-t-butylphenyl)iodonium trifluoromethanesulfonate (C-1)
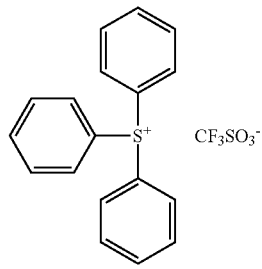

(C-2)
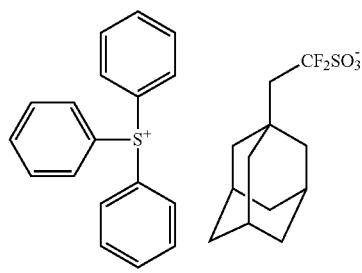

(C-3)
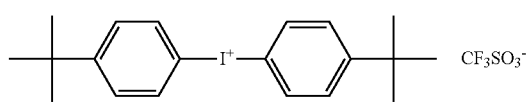

Solvent (D)

D-1: propylene glycol monomethyl ether acetate

D-2: propylene glycol monoethyl ether

D-3: propylene glycol monopropyl ether

Example 1

A polysiloxane composition of Example 1 was obtained by mixing 9.70 parts by mass of a solution containing the polysiloxane (A-1) as the polysiloxane (A), and 0.05 parts by mass of the (B-1) as the compound (B), and 68.74 parts by mass of (D-1) and 21.51 parts by mass of (D-2) as the solvent (D) were mixed to permit dissolution, followed by filtration with a filter having a pore size of 0.2 μm.

Examples 2 to 31 and Comparative Examples 1 to 6

Each polysiloxane composition was prepared in a similar manner to Example 1 except that each component of the type and the amount blended as shown in Table 2-1, Table 2-2 and Table 3 was used. The amount blended of water in the component (E) means an amount of water added in the preparation of the polysiloxane composition. In Table 2 and Table 3, "-" indicates that the corresponding component was not used.

The content of water in the polysiloxane composition prepared as described above was measured according to a Karl Fischer's method. The value (% by mass) of the water content in the resultant polysiloxane composition is shown together in Table 2-1, Table 2-2 and Table 3.

TABLE 2-1

| | Solution Containing (A) polysiloxane | | (B) Compound | | (D) Solvent | | (E) Water | Water content in polysiloxane composition (% by mass) |
|---|---|---|---|---|---|---|---|---|
| | type | amount blended (parts by mass) | type | amount blended (parts by mass) | type | amount blended (parts by mass) | amount blended (parts by mass) | |
| Example 1 | A-1 | 9.70 | B-1 | 0.05 | D-1/D-2 | 68.74/21.51 | — | 0.3 |
| Example 2 | A-1 | 9.70 | B-2 | 0.05 | D-1/D-2 | 68.74/21.51 | — | 0.3 |
| Example 3 | A-1 | 9.70 | B-3 | 0.05 | D-1/D-2 | 68.74/21.51 | — | 0.3 |
| Example 4 | A-1 | 9.70 | B-4 | 0.05 | D-1/D-2 | 68.74/21.51 | — | 0.3 |
| Example 5 | A-1 | 9.70 | B-5 | 0.05 | D-1/D-2 | 68.74/21.51 | — | 0.3 |
| Example 6 | A-1 | 9.70 | B-6 | 0.05 | D-1/D-2 | 68.74/21.51 | — | 0.3 |
| Example 7 | A-1 | 9.73 | B-1 | 0.02 | D-1/D-2 | 68.74/21.51 | — | 0.3 |
| Example 8 | A-2 | 9.70 | B-1 | 0.05 | D-1/D-2 | 68.74/21.51 | — | 0.1 |
| Example 9 | A-1/A-3 | 8.73/0.97 | B-1 | 0.05 | D-1/D-2 | 68.74/21.51 | — | 0.3 |
| Example 10 | A-1/A-4 | 9.21/0.49 | B-1 | 0.05 | D-1/D-2 | 68.74/21.51 | — | 0.3 |
| Example 11 | A-1/A-6 | 9.21/0.49 | B-1 | 0.05 | D-1/D-2/D-3 | 68.74/17.92/3.59 | — | 0.3 |

TABLE 2-2

| | Solution Containing (A) polysiloxane | | (B) Compound | | (D) Solvent | | (E) Water | Water content in polysiloxane composition (% by mass) |
|---|---|---|---|---|---|---|---|---|
| | type | amount blended (parts by mass) | type | amount blended (parts by mass) | type | amount blended (parts by mass) | amount blended (parts by mass) | |
| Example 12 | A-5/A-6 | 9.21/0.49 | B-1 | 0.05 | D-2/D-3 | 72.33/17.92 | — | 0.3 |
| Example 13 | A-8/A-6 | 9.21/0.49 | B-1 | 0.05 | D-1/D-2/D-3 | 68.74/17.92/3.59 | — | 0.1 |
| Example 14 | A-7/A-6 | 9.21/0.49 | B-1 | 0.05 | D-1/D-2/D-3 | 68.74/17.92/3.59 | — | 0.3 |
| Example 15 | A-7 | 9.70 | B-1 | 0.05 | D-1/D-2 | 68.74/21.51 | — | 0.3 |
| Example 16 | A-1 | 9.70 | B-1 | 0.05 | D-1/D-2 | 68.40/21.35 | 0.50 | 0.8 |
| Example 17 | A-1/A-4 | 9.21/0.49 | B-1 | 0.05 | D-1/D-2 | 68.05/21.20 | 1.00 | 1.3 |
| Example 18 | A-1 | 9.70 | B-1 | 0.05 | D-1/D-2 | 68.05/21.20 | 1.00 | 1.1 |
| Comparative Example 1 | A-1 | 9.70 | b-1 | 0.05 | D-1/D-2 | 68.74/21.51 | — | 0.3 |
| Comparative Example 2 | A-1 | 9.70 | b-2 | 0.05 | D-1/D-2 | 68.74/21.51 | — | 0.3 |
| Comparative Example 3 | A-1 | 9.75 | — | — | D-1/D-2 | 68.74/21.51 | — | 0.3 |
| Comparative Example 4 | A-1/A-3 | 8.78/0.97 | — | — | D-1/D-2 | 68.74/21.51 | — | 0.3 |

TABLE 3

| | Solution Containing (A) Polysiloxane | | (B) Compound | | (C) Compound | | (D) Solvent | | (E) water | Water content in polysiloxane composition (% by mass) |
|---|---|---|---|---|---|---|---|---|---|---|
| | type | amount blended (parts by mass) | type | amount blended (parts by mass) | type | amount blended (parts by mass) | type | amount blended (parts by mass) | amount blended (parts by mass) | |
| Example 19 | A-1 | 9.85 | B-1 | 0.02 | C-1 | 0.01 | D-1/D-2 | 68.39/21.23 | 0.50 | 0.8 |
| Example 20 | A-1 | 9.71 | B-2 | 0.02 | C-1 | 0.04 | D-1/D-2 | 48.60/40.63 | 1.00 | 1.3 |
| Example 21 | A-1 | 9.62 | B-3 | 0.05 | C-1 | 0.02 | D-2 | 89.82 | 0.50 | 0.8 |
| Example 22 | A-1 | 9.80 | B-4 | 0.02 | C-1 | 0.02 | D-2 | 89.66 | 0.50 | 0.8 |
| Example 23 | A-1 | 9.43 | B-5 | 0.02 | C-1 | 0.09 | D-2 | 88.46 | 2.00 | 2.3 |
| Example 24 | A-1 | 9.43 | B-6 | 0.02 | C-1 | 0.09 | D-1/D-2 | 88.38/2.08 | — | 0.3 |
| Example 25 | A-1 | 9.26 | B-1 | 0.05 | C-2 | 0.08 | D-1/D-2 | 87.48/2.13 | 1.00 | 1.3 |

TABLE 3-continued

| | Composition | | | | | | | | |
|---|---|---|---|---|---|---|---|---|---|
| | Solution Containing (A) Polysiloxane | | (B) Compound | | (C) Compound | | (D) Solvent | | (E) water |
| | type | amount blended (parts by mass) | type | amount blended (parts by mass) | type | amount blended (parts by mass) | type | amount blended (parts by mass) | amount blended (parts by mass) | Water content in polysiloxane composition (% by mass) |
| Example 26 | A-1 | 9.80 | B-1 | 0.02 | C-3 | 0.02 | D-2 | 89.68 | 0.50 | 0.8 |
| Example 27 | A-1/A-6 | 9.19/0.48 | B-1 | 0.03 | C-1 | 0.02 | D-1/D-2 | 68.12/21.66 | 0.50 | 0.8 |
| Example 28 | A-9 | 9.80 | B-1 | 0.02 | C-1 | 0.02 | D-1/D-2 | 68.04/21.12 | 1.00 | 1.1 |
| Example 29 | A-10 | 9.80 | B-1 | 0.02 | C-1 | 0.02 | D-1/D-2 | 68.04/21.12 | 1.00 | 1.3 |
| Example 30 | A-11 | 9.09 | B-1 | 0.08 | C-1 | 0.08 | D-1/D-2 | 69.51/19.24 | 2.00 | 2.3 |
| Example 31 | A-1 | 9.71 | B-1 | 0.05 | — | — | D-1/D-2 | 68.04/21.20 | — | 0.3 |
| Comparative Example 5 | A-1 | 9.71 | — | — | — | — | D-1/D-2 | 68.04/20.96 | 1.00 | 1.3 |
| Comparative Example 6 | A-1 | 9.71 | — | — | C-1 | 0.05 | D-1/D-2 | 68.04/21.20 | 1.00 | 1.3 |

Evaluations

Using the polysiloxane compositions of the aforementioned Examples and Comparative Examples, each silicon-containing film was provided according to the following method, and evaluations of the resultant silicon-containing film were made on the substrate reflectance, residual resist amount, alkaline resistance and oxygen-ashing resistance, according to the method described below. In addition, according to the following method, an evaluation on lithography of the resist pattern formed on the silicon-containing film was made. The results of evaluations obtained are shown in Table 4 and Table 5 below.

Providing Silicon-Containing Film

The polysiloxane composition was coated on a silicon wafer using a coater/developer (CLEAN TRACK ACT12, manufactured by Tokyo Electron Limited, the same was used for coating unless otherwise described particularly in the following) according to a spin coating method. The resultant coating film was subjected to PB on a hot plate at 220° C. for 1 min to provide a silicon-containing film. The film thickness of the resultant silicon-containing film measured using a film thickness measuring device (M-2000D; manufactured by J. A. Woollam) was 30 nm. Each evaluation of the resultant silicon-containing film was made according to the method shown below.

Substrate Reflectance

The refractive index parameter (n) and the extinction coefficient (k) of each of the obtained silicon-containing film, other composition for underlayer film formation (NFC HM8006, manufactured by JSR Corporation) and a resist composition (ARF AR2772JN, manufactured by JSR Corporation) were measured by a high-speed spectroscopic ellipsometer (M-2000; manufactured by J. A. Woollam). The substrate reflectance under a condition involving NA of 1.3 and Dipole, of a laminate obtained by laminating the resist film, the silicon-containing film and the other resist underlayer film was determined from the measured values using a simulation software ("Prolith" manufactured by KLA-Tencor). The evaluation was made as: "A" in the case in which the substrate reflectance was no greater than 1%; and "B" in the case in which the substrate reflectance was greater than 1%.

Residual Resist Amount

The resist composition was spin-coated onto the provided silicon-containing film, and prebaked (PB) at 100° C. for 60 sec on a hot plate to provide a resist coating film having a film thickness of 100 nm. Subsequently, the entire surface of the resist coating film was exposed using an ArF immersion scanner ("S306C" manufactured by Nikon Corporation). Next, the resist coating film was developed with a 2.38% by mass aqueous TMAH solution for 1 min, and then the film thickness of the film on the substrate after the exposure (i.e., the silicon-containing film and the residual resist coating film) was measured using the film thickness measuring apparatus. The difference between the measured film thickness and the thickness of the silicon-containing film before the exposure was determined, whereby the residual resist amount (nm) was calculated. The residual resist amount is represented by the value (unit: nm). The evaluation of the residual resist amount may be made as: "favorable" in the case in which the difference is less than 5 nm; and "unfavorable" in the case in which the residual resist amount exceeds 5 nm.

Alkaline Resistance

A silicon wafer on which a silicon-containing film had been provided was immersed in an aqueous TMAH solution for 1 min, and the film thicknesses of the silicon-containing film before and after the treatment were determined. In the case in which the difference of the film thicknesses before and after the treatment was no greater than 1 nm, the alkaline resistance was evaluated as "A", and in the case in which the difference of the film thicknesses before and after the treatments exceeds 1 nm was evaluated as "B".

Oxygen-Ashing Resistance

The provided silicon-containing film was subjected to an O$_2$ treatment at 100 W for 120 seconds using an ashing system ("NA1300" manufactured by ULVAC). The difference between the film thicknesses of the silicon-containing film before and after the O$_2$ treatment was determined. The numerical values of the difference of the film thicknesses are shown. The evaluation of the oxygen-ashing resistance may be made as: "favorable" in the case in which the difference of the film thicknesses was less than 5 nm; "somewhat favorable" in the case in which the difference was 5 nm or greater and 8 nm or less; and "unfavorable" in the case in which the difference was greater than 8 nm.

Lithography Performance

Case of Development with an Alkali

After a composition for providing an underlayer antireflective film (HM8006, manufactured by JSR Corporation) was spin-coated on a 12 inch silicon wafer, PB was carried out at 250° C. for 60 seconds to provide an underlayer antireflective film having a film thickness of 100 nm. On this underlayer antireflective film, polysiloxane composition was spin-coated, and subjected to PB at 220° C. for 60 seconds, followed by cooling at 23° C. for 60 seconds to provide a silicon-containing film having a film thickness of 30 nm. Next, a resist composition (ARF AR2772JN, manufactured by JSR Corporation) was spin-coated on the silicon-containing film, and subjected to PB at 100° C. for 60 seconds, followed by cooling at 23° C. for 30 seconds to provide a resist film having a film thickness of 100 nm. Furthermore, a composition for providing an upperlayer film was spin-coated using a coater/developer (Lithius Pro-I; manufactured by Tokyo Electron Limited) on the provided resist coating film, and subjected to PB at 90° C. for 60 seconds to provide an upperlayer film having a film thickness of 90 nm.

Subsequently, exposure was carried out through a mask having a mask size for formation of 42 nm line/84 nm pitch using an ArF Immersion Scanner ("S610C", manufactured by NIKON) under an optical condition of Dipole with NA of 1.30. Post exposure baking (PEB) was carried out on a hot plate of the aforementioned "Lithius Pro-i" at 100° C. for 60 seconds, followed by cooling at 23° C. for 30 seconds. Thereafter, puddle development was carried out for 30 seconds with an LD nozzle of a cup for development using an aqueous TMAH solution as a developer, followed by rinsing with ultra pure water as a rinse liquid. Thereafter, a resist pattern of 42 nm line/84 nm pitch was formed by further spin drying through swinging off at 2,000 rpm for 15 seconds to obtain a substrate for evaluation.

In the formation of the resist pattern, a dose at which a resist pattern having a line width of 42 nm and a line-to-line distance (space) of 84 nm (i.e., ratio of line-and-space is 1:2) was formed was defined as an optimum dose. The exposure step was sequentially performed while increasing the dose stepwise starting from the optimum exposure dose to obtain each substrate for evaluation.

Using the substrate for evaluation, evaluations of the pattern collapse resistance and the pattern configuration were made according to the following method. A scanning electron microscope (CG-4000, manufactured by Hitachi High-Technologies Corporation) was used for observation and line-width measurement of the resist pattern in these evaluations.

As the exposure dose is increased stepwise, the line width of the resultant pattern gradually decreases; therefore, the resist pattern collapse is observed when the resist pattern has a line width corresponding to a given dose. A line width corresponding to the maximum dose at which the resist pattern did not collapse was defined as the minimum pre-collapse dimension (nm), and used as an index of the pattern collapse resistance. The measurements of the minimum pre-collapse dimension (unit: nm) are shown in Table 4 and Table 5. It is to be noted that the denotation of "-" in Table 4 and Table 5 indicates that even if the dose was changed variously, pattern collapse occurred, whereby the evaluation of the pattern collapse was impossible. The pattern collapse resistance was evaluated as "A" in the case in which the minimum pre-collapse dimension determined was no greater than 40 nm, and "B" in the case in which the minimum pre-collapse dimension exceeds 40 nm or the case in which even if the dose was changed variously, pattern collapse occurred, whereby the evaluation of the pattern collapse was impossible. The pattern configuration was evaluated as "A" in the case in which tailing was not found at the bottom of the resist pattern, and "B" in the case in which pattern collapse or tailing was found.

Case of Development with an Organic Solvent

In the case of the development with an alkali, a substrate for evaluation on which resist patterns were formed was obtained in a similar manner to the case of the development with an alkali except that: the exposure was carried out using a mask for forming a pattern of 40 nm line/80 nm pitch as the mask; butyl acetate was used as the developer solution; and methylisobutyl carbinol (MIBC) was used as the rinse liquid. In the formation of the resist pattern, a dose at which a resist pattern having a line width of 40 nm and a line-to-line distance (space) of 80 nm (i.e., ratio of line-and-space is 1:2) was formed was defined as an optimum dose. The exposure step was sequentially performed while increasing the dose stepwise starting from the optimum exposure dose to obtain each substrate for evaluation. Using the resultant substrate for evaluation, evaluations of the pattern collapse resistance and the pattern configuration were made according to the aforementioned method and evaluation criteria.

TABLE 4

| | | | | | Lithography performance Development with an alkali | | |
|---|---|---|---|---|---|---|---|
| | | | | | pattern collapse resistance | | |
| | Substrate reflectance | Residual resist amount (nm) | Alkaline resistance | Oxygen ashing resistance (nm) | minimum pre-collapse dimension (nm) | Evaluation | pattern configuration |
| Example 1 | A | <1 | A | 3 | 30 | A | A |
| Example 2 | A | <1 | A | 3 | 30 | A | A |
| Example 3 | A | <1 | A | 3 | 30 | A | A |
| Example 4 | A | <1 | A | 3 | 30 | A | A |
| Example 5 | A | <1 | A | 3 | 30 | A | A |
| Example 6 | A | <1 | A | 3 | 35 | A | A |
| Example 7 | A | <1 | A | 3 | 30 | A | A |
| Example 8 | A | <1 | A | 3 | 30 | A | A |
| Example 9 | A | <1 | A | 5 | 30 | A | A |
| Example 10 | A | <1 | A | 3 | 30 | A | A |
| Example 11 | A | <1 | A | 5 | 30 | A | A |
| Example 12 | A | <1 | A | 5 | 30 | A | A |
| Example 13 | A | <1 | A | 5 | 30 | A | A |
| Example 14 | A | <1 | A | 5 | 30 | A | A |
| Example 15 | A | <1 | A | 5 | 30 | A | A |
| Example 16 | A | <1 | A | 3 | 30 | A | A |
| Example 17 | A | <1 | A | 3 | 30 | A | A |

TABLE 4-continued

| | | | | Lithography performance Development with an alkali | | | |
|---|---|---|---|---|---|---|---|
| | | | | pattern collapse resistance | | | |
| | Substrate reflectance | Residual resist amount (nm) | Alkaline resistance | Oxygen ashing resistance (nm) | minimum pre-collapse dimension (nm) | Evaluation | pattern configuration |
| Example 18 | A | <1 | A | 3 | 30 | A | A |
| Comparative Example 1 | A | <1 | A | 3 | — | B | B |
| Comparative Example 2 | A | <1 | A | 3 | — | B | B |
| Comparative Example 3 | A | <1 | A | 3 | — | B | B |
| Comparative Example 4 | A | <1 | A | 5 | 35 | A | A |

TABLE 5

| | | Lithography performance | | | | | |
|---|---|---|---|---|---|---|---|
| | | development with an alkali | | | | development with an organic solvent | |
| | | | pattern collapse resistance | | | | |
| | Substrate reflectance | Oxygen ashing resistance (nm) | minimum pre-collapse dimension (nm) | evaluation | pattern configuration | pattern collapse resistance | pattern configuration |
| Example 19 | A | 3 | 35 | A | A | A | A |
| Example 20 | A | 3 | 35 | A | A | A | A |
| Example 21 | A | 3 | 35 | A | A | A | A |
| Example 22 | A | 3 | 35 | A | A | A | A |
| Example 23 | A | 3 | 35 | A | A | A | A |
| Example 24 | A | 3 | 35 | A | A | A | A |
| Example 25 | A | 3 | 35 | A | A | A | A |
| Example 26 | A | 3 | 35 | A | A | A | A |
| Example 27 | A | 5 | 35 | A | A | A | A |
| Example 28 | A | 3 | 35 | A | A | A | A |
| Example 29 | A | 3 | 35 | A | A | A | A |
| Example 30 | A | 5 | 35 | A | A | A | A |
| Example 31 | A | 3 | 35 | A | A | B | B |
| Comparative Example 5 | A | 3 | — | B | B | B | B |
| Comparative Example 6 | A | 3 | — | B | B | A | A |

From the results shown in Table 4 and Table 5, it was demonstrated that a resist pattern can be formed that is superior in pattern collapse resistance and has an excellent pattern configuration while maintaining the substrate reflectance, residual resist amount, alkaline resistance and oxygen-ashing resistance, according to the silicon-containing film provided from the polysiloxane composition of Examples containing the compound (B) in addition to the polysiloxane (A). In addition, it was also demonstrated that due to further containing the compound (C) in the polysiloxane composition, the aforementioned effects are achieved not only in the case of development with an alkali, but also in the case of development with an organic solvent.

The polysiloxane composition according to the embodiment of the present invention is suitable as a composition for providing a resist underlayer film. According to the polysiloxane composition and the pattern-forming method of the embodiments of the present invention, a resist pattern having superior pattern collapse resistance and an excellent pattern configuration can be formed. Also, a desired pattern can be consequently transferred to a substrate to be processed with good reproducibility and fidelity. Therefore, the polysiloxane composition and pattern-forming method can be suitably used for pattern formation in which a multilayer resist process is used, in particular, pattern formation in which a multilayer resist process is used within a finer range of less than 60 nm (ArF, ArF in liquid immersion lithography, $F_2$, EUV, nanoimprint).

Obviously, numerous modifications and variations of the present invention are possible in light of the above teachings. It is therefore to be understood that within the scope of the appended claims, the invention may be practiced otherwise than as specifically described herein.

The invention claimed is:

1. A pattern-forming method comprising:
   applying polysiloxane composition on a substrate to be processed to provide a silicon-containing film;
   applying a resist composition on the silicon-containing film to provide a resist coating film;
   selectively irradiating the resist coating film with a radioactive ray through a photomask to expose the resist coating film;
   developing the exposed resist coating film to form a resist pattern; and
   sequentially dry etching the silicon-containing film and the substrate to be processed using the resist pattern as a mask,
   wherein the polysiloxane composition comprises:
      a polysiloxane; and
      a first compound comprising:
         a nitrogen-containing heterocyclic ring structure; and
         a polar group which is an ester group, the ester group bonding to a nitrogen atom of the nitrogen-containing heterocyclic ring structure,
   wherein a content of the polysiloxane in the polysiloxane composition is no less than 70% by mass based on a total solid content of the polysiloxane composition, and
   wherein the polysiloxane composition does not contain a compound that generates an acid by irradiation with an ultraviolet ray, by heating or a combination thereof.

2. The pattern-forming method according to claim 1, wherein the first compound further comprises an additional polar group which is different from the ester group.

3. The pattern-forming method according to claim 1, wherein the first compound comprises an additional polar group which is a hydroxyl group, a carboxyl group or a combination thereof.

4. The pattern-forming method according to claim 1, wherein the ester group is included in a group represented by formula (i):

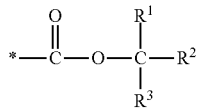

(i)

wherein, in the formula (i), $R^1$, $R^2$ and $R^3$ each independently represent an alkyl group having 1 to 4 carbon atoms, or a monovalent alicyclic hydrocarbon group having 4 to 12 carbon atoms, wherein $R^1$ and $R^2$ may taken together represent a bivalent alicyclic hydrocarbon group having 4 to 12 carbon atoms together with the carbon atom to which $R^1$ and $R^2$ bond; and * denotes a binding site to the nitrogen atom of the nitrogen-containing heterocyclic ring structure.

5. The pattern-forming method according to claim 4, wherein the first compound is a compound represented by formula (1):

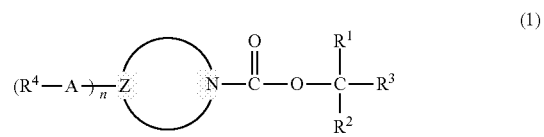

(1)

wherein, in the formula (1), $R^1$, $R^2$ and $R^3$ are as defined in the formula (i); Z represents a group having a valency of (n+2) and representing a heterocyclic ring structure together with a nitrogen atom; A represents a single bond or a bivalent hydrocarbon group having 1 to 8 carbon atoms; $R^4$ represents a hydroxyl group or a carboxyl group; n is an integer of 1 to 6, wherein in a case in which A are present in a plurality of number, a plurality of As are each a same or different and in a case in which $R^4$ are present in a plurality of number, a plurality of $R^4$s are each a same or different.

6. The pattern-forming method according to claim 1, wherein the polysiloxane comprises a hydrolytic condensate of a compound represented by formula (S-1):

$$R^5_a SiX_{4-a} \quad (S-1)$$

wherein, in the formula (S-1), $R^5$ represents a hydrogen atom, an alkyl group having 1 to 5 carbon atoms, a cyano group, an alkenyl group or an aryl group, wherein a part or all of hydrogen atoms included in the alkyl group represented by $R^5$ are not substituted or substituted by a fluorine atom, a cyano group, a substituted or unsubstituted aryl group, or an alkoxy group having an oxetane ring; X represents a halogen atom or $OR^A$, wherein $R^A$ represents a monovalent organic group; and a is an integer of 0 to 3, wherein in a case in which $R^5$ are present in a plurality of number, a plurality of $R^5$s are each a same or different and in a case in which X are present in a plurality of number, a plurality of Xs are each a same or different.

7. The pattern-forming method according to claim 6, wherein X in the formula (S-1) represents $OR^A$.

8. The pattern-forming method according to claim 1, wherein a content of the first compound with respect to 100 parts by mass of the polysiloxane is no less than 0.1 parts by mass and no greater than 30 parts by mass.

9. The pattern-forming method according to claim 1, wherein the polysiloxane composition further comprises water.

10. The pattern-forming method according to claim 9, wherein a content of the water in the polysiloxane composition is 0.1 to 20% by mass.

11. The pattern-forming method according to claim 1, wherein the nitrogen-containing heterocyclic ring structure is an aliphatic heterocyclic ring structure, an imidazole structure, a benzimidazole structure, an indole structure, an isoindole structure, a purine structure, a 6-one-purine structure, a pyrazole structure, a pyrrole structure, a pyridine structure, a pyrimidine structure, a pyridazine structure, an indolizine structure, a quinolizine structure, a quinoline structure, an isoquinoline structure, a carbazole structure, an acridine structure, a phenazine structure, or a phenoxazine structure.

12. The pattern-forming method according to claim 1, wherein the nitrogen-containing heterocyclic ring structure is a piperidine structure, a pyrrolidine structure, an imidazole structure, or a benzoimidazole structure.

* * * * *